(12) United States Patent
Pallonen et al.

(10) Patent No.: US 7,764,935 B2
(45) Date of Patent: Jul. 27, 2010

(54) PHASE AND POWER CALIBRATION IN ACTIVE ANTENNAS

(75) Inventors: Jorma Pallonen, Kirkkonummi (FI); Murat Ermutlu, Helsinki (FI); Marko Leukkunen, Oulu (FI); Kauko Heinikoski, Oulu (FI)

(73) Assignee: Nokia Corporation, Espoo (FI)

( * ) Notice: Subject to any disclaimer, the term of this patent is extended or adjusted under 35 U.S.C. 154(b) by 720 days.

(21) Appl. No.: 11/644,484

(22) Filed: Dec. 21, 2006

(65) Prior Publication Data

US 2008/0153433 A1 Jun. 26, 2008

(51) Int. Cl.
*H04B 17/00* (2006.01)

(52) U.S. Cl. .............. 455/115.1; 455/67.11; 455/67.16; 455/126

(58) Field of Classification Search .................. 455/103, 455/104, 114.1, 115.1, 123, 126, 67.11, 67.16, 455/272, 276.1
See application file for complete search history.

(56) References Cited

U.S. PATENT DOCUMENTS

| | | | | |
|---|---|---|---|---|
| 3,754,188 A * | 8/1973 | Wilkens | ...................... | 455/105 |
| 4,308,620 A * | 12/1981 | Grousseau | .................. | 455/75 |
| 4,451,832 A * | 5/1984 | Stites | ......................... | 343/858 |
| 4,718,111 A * | 1/1988 | Jongsma | ..................... | 455/105 |
| 5,412,414 A * | 5/1995 | Ast et al. | ..................... | 342/174 |
| 5,477,229 A | 12/1995 | Caille et al. | .................. | 342/360 |
| 5,530,449 A | 6/1996 | Wachs et al. | ................ | 342/174 |
| 5,534,807 A * | 7/1996 | Inada et al. | .................. | 327/234 |
| 5,613,219 A * | 3/1997 | Vogel et al. | .................... | 455/78 |
| 5,815,803 A * | 9/1998 | Ho et al. | ........................ | 455/78 |
| 6,163,296 A | 12/2000 | Lier et al. | ..................... | 342/417 |
| 6,507,315 B2 | 1/2003 | Purdy et al. | .................. | 342/374 |
| 6,760,572 B2 * | 7/2004 | Noori | .......................... | 455/137 |
| 6,799,020 B1 * | 9/2004 | Heidmann et al. | .......... | 455/103 |
| 7,236,753 B2 * | 6/2007 | Zipper | ......................... | 455/102 |
| 2002/0027958 A1 * | 3/2002 | Kolanek | ...................... | 375/297 |
| 2002/0186434 A1 * | 12/2002 | Roorda et al. | ................ | 359/128 |
| 2004/0063469 A1 | 4/2004 | Kuwahara et al. | ......... | 455/562.1 |
| 2005/0215206 A1 | 9/2005 | Granstrom et al. | ........... | 455/102 |
| 2008/0160935 A1 * | 7/2008 | Rexberg | ................... | 455/114.3 |

FOREIGN PATENT DOCUMENTS

EP  0 713 261 A1  5/1996
EP  1 708 385 A2  10/2006

* cited by examiner

*Primary Examiner*—Duc M Nguyen
(74) *Attorney, Agent, or Firm*—Harrington & Smith

(57) ABSTRACT

A switch is particularly advantageous for calibration of signal phase between transmitters, and other uses. The switch has a first data input adapted to input a transmit signal from a first transmitter, a first data output, at least one and preferably multiple bidirectional data ports, and a control input adapted to selectively couple in a first case the first data input to one of the bidirectional data ports, and in a second case one of the bidirectional data ports and the first data input to the first data output. By coupling one data port of the switch to a data port of another identical switch, a transmit signal from another transmitter can be ported to the first said switch, and both signals output to a feedback circuit that finds the phase difference and applies it to a new signal input to one of the transmitters. Beamforming and MIMO uses are also detailed.

29 Claims, 19 Drawing Sheets

PHASE AND POWER CALIBRATION IN ACTIVE ANTENNAS

CROSS-REFERENCE TO RELATED APPLICATION

The subject matter of this application is related in part to co-owned U.S. patent application Ser. No. 11/635,091, filed on Dec. 5, 2006, entitled "Calibration for Re-Configurable Antennas", by inventors Murat Ermutlu and Jorma Pallonen, the contents of which are incorporated by reference.

TECHNICAL FIELD

The teachings detailed herein relate to arrayed antenna systems, such as phased array antennas at a base station. It is most particularly related to calibrating phase and/or power in active antenna elements of such an array for beam-forming incoming and transmitted signals.

BACKGROUND

Continued demand for higher wireless data rates drives advances in multiple aspects of wireless communications systems and methods. Relevant to this invention is beam-forming at an array of antenna elements. In such an array, individual antenna elements are used to beamform signals to and from the transceivers connected to those antenna elements so as to add antenna diversity to the wireless signals. Antenna diversity enables the receiver to capture, and the transmitter to emphasize, different wireless pathways that a signal follows between sender and recipient. By resolving these multi-paths and adding to them with MIMO techniques, a fading signal can be more reliably decoded so that less bandwidth is required for re-transmissions and error correction/control. Different active sets of antenna elements in the array may be used at different times and for different signals, so in an ideal case the choice of the active antenna element set is dynamic. Currently, arrayed antenna systems are typically disposed at fixed terrestrial locations such as wireless base stations of a cellular/PCS network, land-based military sensing stations, and in orbiting satellites.

An important consideration in arrayed antenna elements is calibration, specifically phase and power. For a spread spectrum signal, the phase of a signal received at different antennas may vary by the time it reaches the receiver for despreading and decoding, due to different electrical path lengths from antenna element to receiver. These phase errors need to be corrected for proper despreading in a correlator. Further, the signal power must also be closely matched at the receiver while the signal is still spread so that both versions can be readily recovered. Similar considerations apply to beam-formed transmissions. Because there are multiple antenna elements and the active set of antenna elements changes for different signals and conditions, the problem of calibration is highly complex. The state of the art has evolved several ways to deal with this calibration problem.

Some prior art approaches have favored the use of directional couplers to find the relative phase and amplitude differences for signals at different antenna elements or active sets of elements (e.g., a sub-array), as detailed in the background section of the incorporated reference. Such phase-accurate RF coupling and connection networks impose a constraint in manufacturing of arrayed antennas because the prior art tends to rely on close tolerances for the physical length (of coaxial cable, microstrip lines, etc.) between the antenna port and the calibration port. A costly measurement system during manufacture is also necessary to account for the true propagation speed of the conductive media between those ports, which typically varies over a fairly broad range for any arbitrary manufacturing lot, so accuracy of the phase electrical length cannot rely on physical length of the conduit alone. In PCB materials used in the antenna elements, the relative dielectric constant $\in_r$ also typically varies between the x and y directions, so that the signal propagation speeds and hence the electrical lengths vary as a function of direction. However, phase accuracy is a key parameter in effectively using an antenna array system.

In general, it is mandatory for adaptive antennas and beneficial for MIMO antennas that phase and power distribution over the entire antenna aperture be known and controlled, otherwise the desired radiation pattern will not be formed. This is also a useful feature for more simple antenna structures if there is a need to tailor the radiation pattern during or after installation. Such would enable integrating the radios/transceivers and the antenna(s) to a common unit and remove the need of having several different antenna versions, which would simplify manufacturer's logistics. Two antenna terms are distinguished: adaptive antennas track mobile user equipment and steer power toward the specific mobile users, and active antennas are antenna radiators that have the radio or RF functionality built in. These teachings are advantageous for both types, which may be also combined into an adaptive active antenna.

SUMMARY

The foregoing and other problems are overcome, and other advantages are realized, in accordance with the presently described embodiments of these teachings.

In accordance with an exemplary embodiment of the invention, there is provided a switch that has a first data input adapted to input a transmit signal, a first data output, at least one bidirectional data port, and a control input. The control input is adapted to selectively couple in a first case the first data input to the bidirectional data port, and in a second case the bidirectional data port and the first data input to the first data output.

In accordance with another exemplary embodiment of the invention, there is provided an array of radios. Each radio includes a transmitter that includes a phase estimation and adjustment block. The switch includes a first data input coupled to an output of the transmitter, a first data output coupled to an input of the phase estimation and adjustment block, at least one bidirectional data port, and a control input. The control input is adapted to selectively couple in a first case the first data input to the bidirectional data port, and in a second case the bidirectional data port and the first data input to the first data output. In the array of radios, at least one of the bidirectional data ports of each switch is coupled to at least one bidirectional data port of at least one other switch. Further in the array is a processor having outputs coupled to each of the control inputs of the switches for coordinating, among switches that are coupled to one another via their bidirectional data ports, the selective coupling noted above for the first and second cases.

In accordance with another exemplary embodiment of the invention, there is provided a method. In this method, a first transmit signal from a first transmitter is processed in a feedback circuit, and a first phase of the processed first transmit signal is measured. A second transmit signal from a second transmitter is processed in the feedback circuit, and a second phase of the processed second transmit signal is measured. A phase difference between the first phase and the second phase is determined, and another signal, input to the first transmitter, is adjusted using the phase difference.

In accordance with another exemplary embodiment of the invention, there is provided an integrated circuit that includes a processor, a switch, a transmitter, a phase estimator, a phase adjuster, and a frequency downconverter. The switch includes a first data input coupled to an output of the transmitter, and a first data output coupled to an input of the phase estimator through the frequency downconverter, and at least one bidirectional data port, and a control input coupled to the processor. The control input is adapted to selectively couple in a first case the first data input to the bidirectional data port, and in a second case the bidirectional data port and the first data input to the first data output.

In accordance with another embodiment of the invention there is provided a computer program product, embodied on a computer readable storage medium, that includes instructions to cause a digital processor coupled to the storage medium to execute operations directed toward selectively coupling transceivers to one another. In the computer program, the operations include switching a first transmit signal from a first transmitter output through a first switch to a feedback circuit, and switching a second transmit signal, from a second transmitter output, through a second switch to the feedback circuit via the first switch. The operations then include finding a difference in phase between the first and second transmit signals, and adjusting phase of a signal that is input to one of the first and second transmitters based on the found difference.

Further details as to various embodiments and implementations are detailed below.

BRIEF DESCRIPTION OF THE DRAWINGS

The foregoing and other aspects of these teachings are made more evident in the following Detailed Description, when read in conjunction with the attached Drawing Figures.

Figure 1A:
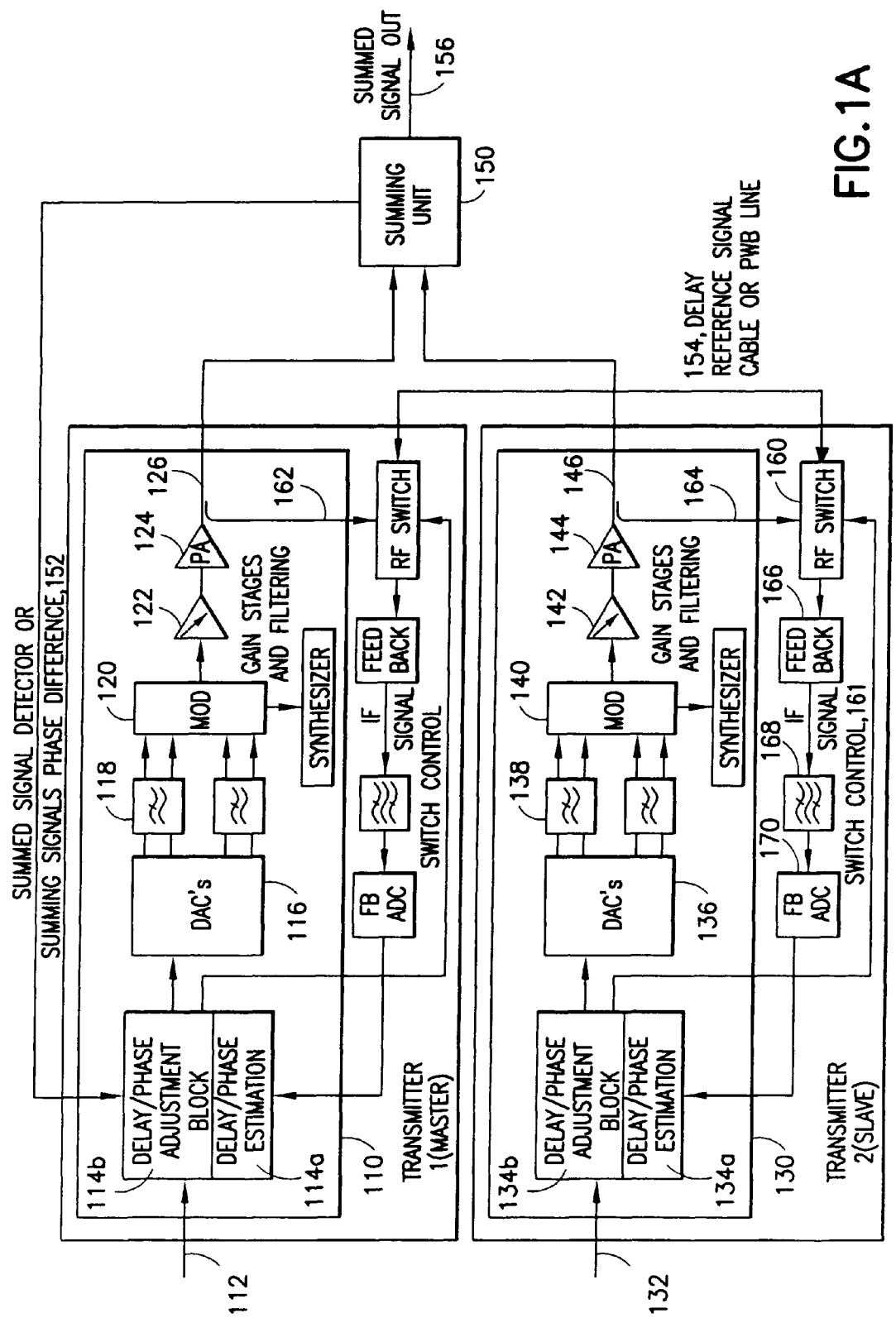
FIG. 1A is a schematic overview of two transmitters coupled to a summing unit and also directly to one another via a switch and feedback circuit according to one embodiment of the invention.

These and other aspects are detailed more fully below.

DETAILED DESCRIPTION OF EMBODIMENTS OF THE INVENTION

The calibration problem has typically been addressed in the prior art during the manufacturing process to assure close tolerances in physical length of signal calibration pathways. As above, this is difficult in that the electrical path length requires more than close physical path length tolerances due to variations in dielectric constant for different batches of manufacturing materials such as circuit board substrates. These are detailed in the background section. For mass production of arrayed antennas, these manufacturer-based solutions are seen to be time consuming and costly in both materials and labor. This challenge increases with the rapid adoption of beamforming, and with multiple transceivers coupled to an array of antennas such as at a base transceiver station used in a wireless communication network. The teachings of this invention resolve phase and amplitude/power disparities between multiple transmitters/receivers and a single antenna or multiple antennas, and can be applied to a calibration probe or to fixed wiring/cabling between those transceivers and antenna(s).

FIG. 1 illustrates the general concept for a fixed wiring embodiment on which embodiments of this invention improves, with further detail shown in subsequent drawing figures. A first transmitter 110 has an input node 112 for receiving a signal to be transmitted (generally at an intermediate frequency IF below the intended transmit frequency), a phase (delay/phase) estimation block 114a and a phase (delay/phase) adjustment block 114b for determining and imposing a phase adjustment to the input to the (baseband) input signal, a digital-to-analog converter DAC 116 for converting the signal to analog for transmission, various (low-pass) filters 118 in series with a modulator 120 for modulating the signal to a carrier wave and upconverting the IF signal to transmit radiofrequency RF, variable gain stages 122 for adjusting gain in a fine manner, and a power amplifier 124 for increasing signal power immediately prior to an output node 126 that leads to a transmit antenna (not shown). A second transmitter 130 includes a substantially similar arrangement of identical (or nearly so) components: an input node 132, a phase (delay/phase) estimation block 134a and a phase (delay/phase) adjustment block 134b, a DAC 136, filters 138, a modulator 140, variable gain stages 142, a power amplifier 144, and an output node 146. A summing unit 150 is interposed between the transmit antenna and the output nodes 126, 146.

In the arrangement of FIG. 1A, consider the first transmitter 110 a master and the second transmitter 130 a slave. Within each of the transmitters 110, 130 is a feedback circuit, and the feedback circuit for the second transmitter is detailed below. The feedback circuit processes in reverse the upconverted and modulated signal back to IF, the reverse of what was done in the transmitter, and may share hardware with the receiver portion of the transceiver from which the transmitter is shown. A feedback signal 152 from the summing circuit 150 inputs to the phase adjustment block 114*b* an enable signal, indicating either that a summed signal from both the first and second transmitters 110, 130 is present or that a phase difference between those two signals exceeds some predetermined tolerance threshold. This enables the feedback circuit through a control signal 161 to a switch 160, which couples the master 110 and slave 130 transmitters to one another directly. At signal line 162, the first transmitter 110 taps its own RF transmit signal, which is output to the second transmitter 130 along a crossover line 154. The second/slaved transmitter 130 taps its own transmit signal at signal line 164 like that 162 of the first transmitter 110, and the two signals pass through the switch 160 of one of the feedback circuits. The crossover line 154 may be cabling between integrated circuits on which the different first 110 and second 130 transmitters are printed, or more preferably a hardwired circuit line on an integrated circuit on which is printed both transmitters 110, 130. The control signal 161 from the phase adjustment block 134*b* selectively enables the switch 160 to output its own transmit signal on line 164 to the other transmitter 110, or to accept the transmit signal on line 162 from the first transmitter 110 via the crossover line 154 and send the two transmit signals (originating on lines 162 and 164) back to the phase adjustment block 134*b* through a feedback sub-circuit 166. It is noted that the term transmit signal is used to denote a signal tapped from an output of transmit circuitry (e.g., spreader, modulator, frequency multiplier/upconverter) of a transmitter. It is irrelevant to the transmit calibration aspects of this invention whether or not the transmit signal is actually ported to an antenna and sent over a wireless channel.

The two signals are processed in reverse through the feedback sub-circuit 166 (e.g., demodulated, downconverted to IF, power adjustment if necessary, etc.), filtered as might be prudent 168, and converted to digital at a feedback analog-to-digital converter FB ADC 170. A phase difference between those two signals is sensed at the phase estimation block 134*a* and that difference is applied at the phase adjustment block 114*b* for phase-aligning the signal present at the input node 132 that then passes through the second transmitter 130 to align with that passing through the first transmitter 110, thereby slaving the phase of the second transmitter 130 to that of the first transmitter 110. The in-phase summed signals are then output 156 to the antenna for transmission. Alternatively, the first/master transmitter 110 can adjust its phase to match that of the second/slave transmitter 130 with little change to the description above and using identical hardware.

For brevity of later description, term those components of the feedback loop, apart from the switch 160 (e.g., the feedback cub-circuit 166, filters 168 and FB ADC 170), as a prediction chain or predi chain, since they are used to estimate a phase difference and apply a phase shift. A different arrangement of components may be used as a predi chain apart from those detailed here as an example, to perform similar estimation/adjustment functions. Necessary in the predi chain is a frequency downconverter, since the phase estimation and adjustment is applied to the input node of the transmitter, prior to modulation and frequency upconversion to RF.

Figure 1B:
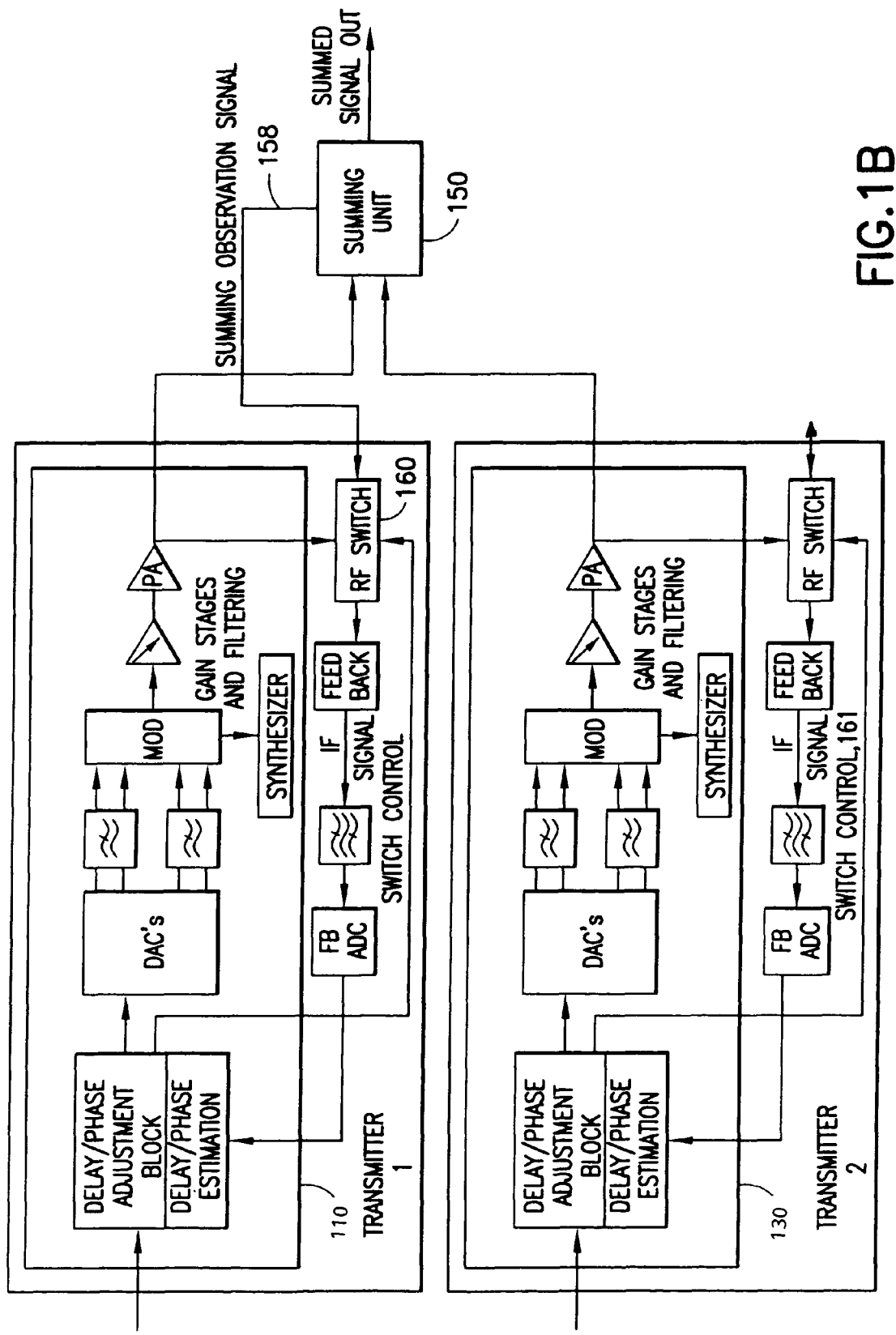
FIG. 1B is similar to FIG. 1A but with the transmitters coupled to one another through the summing unit.

An alternative arrangement is shown in FIG. 1B, identical to FIG. 1A so the similarly illustrated components are not again detailed, except FIG. 1B illustrates the phase of the signal of the first transmitter 110 being adjusted to match that of the second transmitter 130. Distinctions between FIGS. 1A-B include that FIG. 1B uses a direct feedback line 158 from the summing unit 150 to the switch 160 instead of a crossover line 154 as in FIG. 1A, and there is no enable signal in FIG. 1B along the separate feedback line 152 to the phase adjustment block 114*b* as there is in FIG. 1A (though one might be used in the FIG. 1B embodiment if continuous phase-alignment is not desired).

Figure 1C:
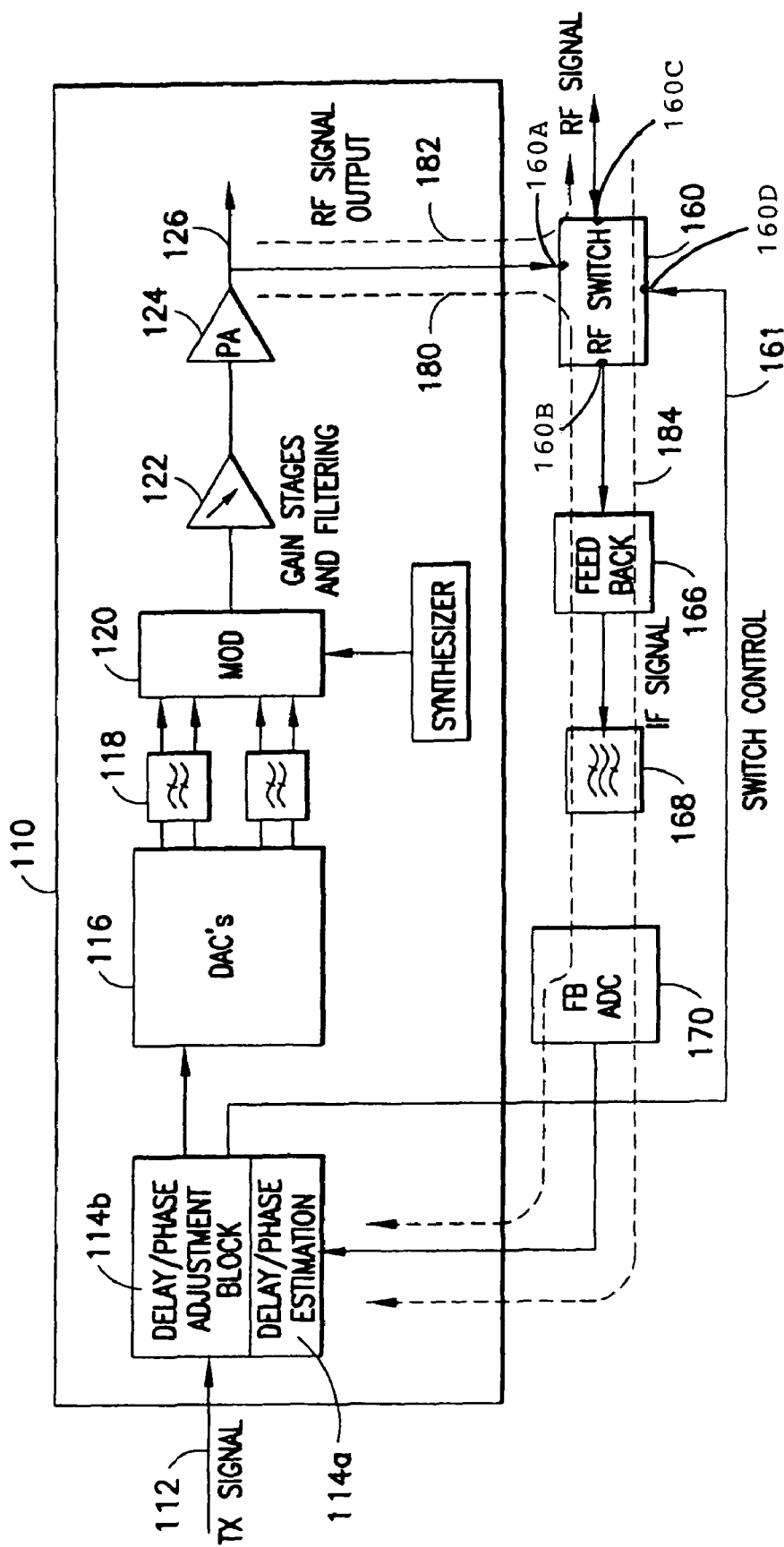
FIG. 1C is a more detailed view of the feedback circuit of FIGS. 1A-1B.

For either of FIGS. 1A-1B, FIG. 1C shows with particularity portions of the feedback circuit. Recognize that FIG. 1C can apply equally to either the slave 130 or master 110 transmitter, depending upon the control signal 161 to the switch 160 at control input port 160D. The RF transmit signal on line 162 of FIGS. 1A-B is input to a first data input port 160A of the switch 160 and then ported to either of two directions, depending on whether the host transmitter associated with the switch 160 is slave or master: a first direction 180 which feeds via a first data output port 160B back to the host transmitter; or in a forward direction 182 via a data port 160C of the switch 160 which outputs toward another transmitter that estimates and applies a phase adjustment to its own signal based on the RF transmit signal following path 182 from the host transmitter. For the case where the host transmitter 110 of FIG. 1C adjusts its own phase, the transmit signal from another transmitter is input at the data port 160C and follows line 184 through the switch 160 where it is output at the first data output port 160B to the predi chain. In this manner the data port 160C of the switch 160 is bidirectional: if the switch 160 is in one transmitter which sends its transmit signal along line 182 to the other transmitter for processing, then the data port 160C acts as an output port, and if the switch 160 is in the transmitter which receives the transmit signal from the other transmitter, the data port 160C is an input port and that other transmitter's signal moves along line 184 of FIG. 1C while the host transmitter's transmit signal moves along line 180. At the phase estimation block 114*a*, the phase difference between those two signals is measured and the difference is applied at the adjustment block 114*b* to the signal at the input node 112. A delay between the two signals is also measured at the delay/phase estimation block 114*a* to account for the longer electrical path length followed by the signal from the other transmitter (along line 184) as compared to that followed by the signal from the host transmitter itself (along line 180) toward the estimation block 114*a*. In this manner, the phase comparison between the two signals can be for the same instance of those different signals. The delay measurement and adjustment dispenses with the need to manufacture physical or electrical path lengths to close tolerances, since the signal processing corrects for disparities that might be fixed in the hardware configuration during manufacture of the transceivers.

Embodiments of the invention enable complex signal adjustments at the delay/phase adjustment block 114*b* from 0-360 degrees in $2^{15}$ increments (32,768 steps). For a system clock running at 76.8 MHz, the steps are at 13 nanosecond intervals and averaged over 15 samples to smooth phase adjustments. This accuracy is used in the performance graphs of FIGS. 3A through 6B.

Figure 4:
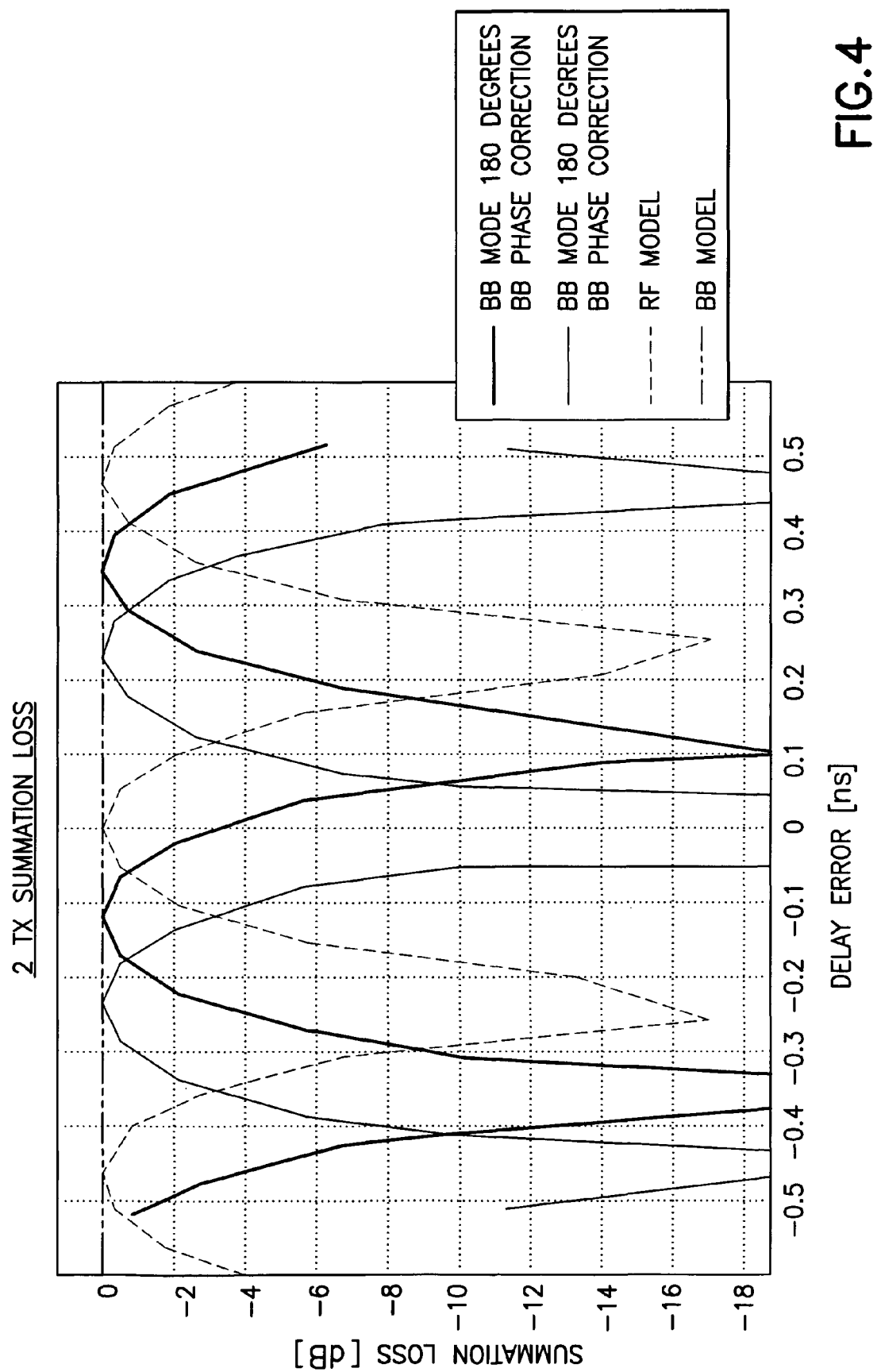
FIG. 4 is a graph similar to FIGS. 3A-3B showing 180 degree phase correction.

FIG. 4 is a logic flow diagram detailing steps according to an embodiment of the invention. At block 402, initial values are set for phase and delay of a signal to be transmitted. At block 404, the phase and delay of the host transmitter's own signal are measured. At block 406, the phase and delay of a transmit signal from another transmitter are measured. At block 408 a phase and delay of a new signal input to one of the transmitters is adjusted, initially by the initial values and later in accordance with the difference found between blocks 404 and 406. At block 410, the summing quality is observed. This may be done at the summing unit 150 by a phase detector to ensure phase cancellation/addition due to summing the signals does not fall below/exceed some prescribed threshold. A need for adjustment is determined at block 412, such as by comparing a phase of the combined signal against a predicted phase (e.g., the predicted phase may be from measuring the slope of phase versus time to ensure smooth transitions, extrapolation from previous phase changes, etc.). Term these generically as tolerances, which may be both high and low thresholds to ensure accuracy in both directions of phase changes. If at block 412 the adjustment is within tolerances, then feedback path 414 is followed and the summing quality is further observed with no immediate changes. If instead phase/delay is out of tolerance, then feedback path 416 is followed and a further adjustment to phase/delay is imposed. In an embodiment, the correction applied at block 408 is the difference between blocks 404 and 406, differentially weighted over a plurality of samples to weight the most recent samples more heavily. The calibration of phase/delay is therefore a continuous process once begun.

Figure 3A:
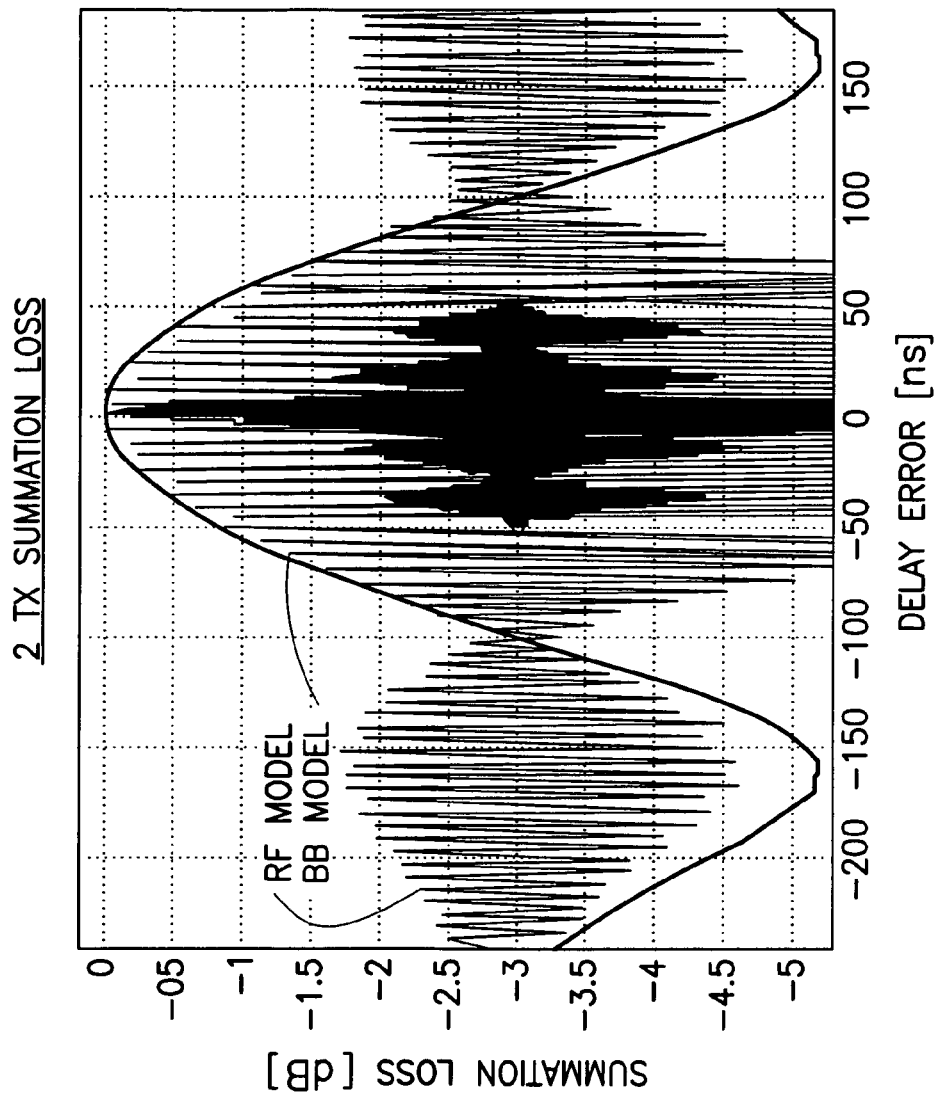
FIG. 3A is a graph of delay error versus summation loss for calibration in the baseband versus at RF frequency.
Figure 3B:
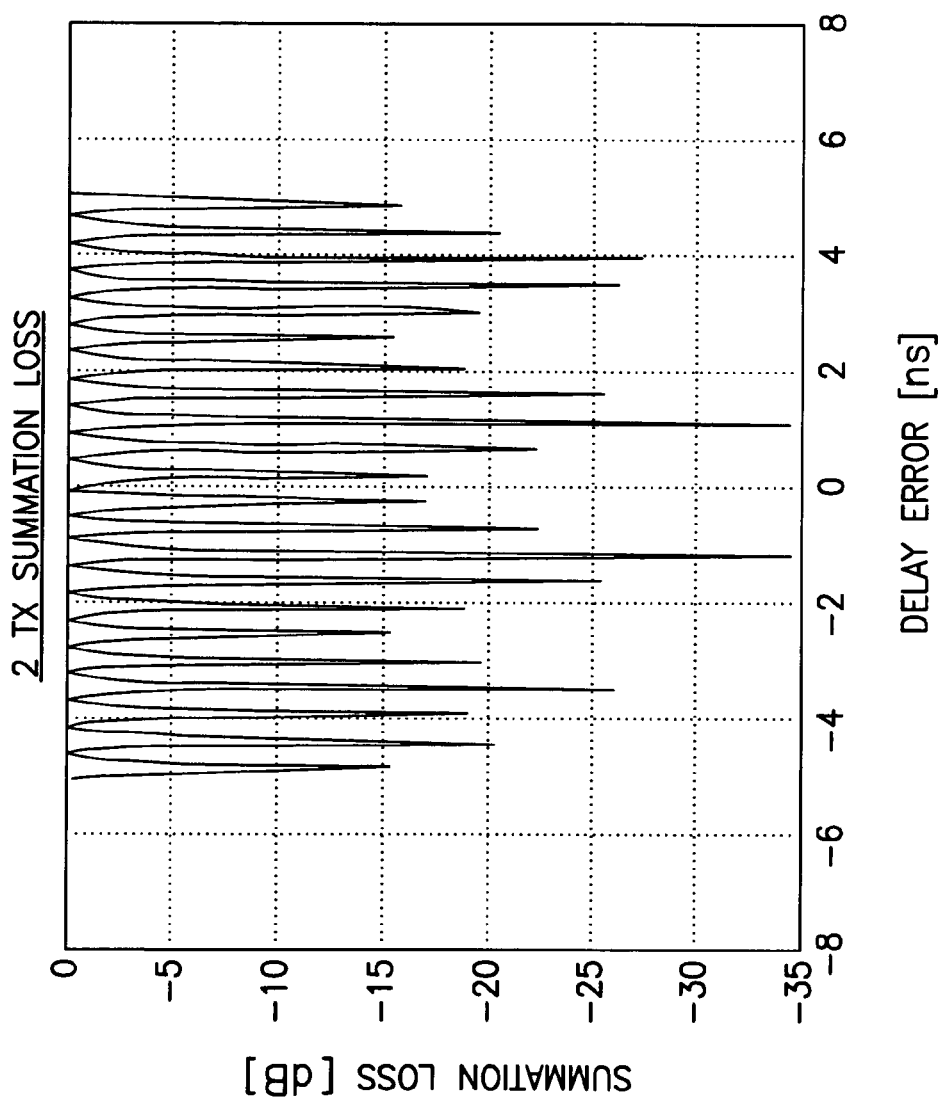
FIG. 3B shows detail of one portion of that graph.

FIG. 3A is a graph (from a simulation of transmit signal summing) of delay error versus summation loss in both baseband BB (smoothed line) and at the transmit radio frequency RF. FIG. 3B shows the portion of the RF plot that is cut off from the bottom of FIG. 3A. Note that at BB, the plot is smoother but exaggerates summation losses as the delay increases (most pronounced at delays of about +/−160 ns in FIG. 3A) as compared to the same signal with delays imposed at RF.

FIG. 4 illustrates a smaller scale view, to 0.1 ns, of delay in the BB with 180 degree phase correction. Note that local maxima and minima can be seen at about 0.5 ns intervals. A plot of the RF model is also shown, also with local maxima separated at about 0.5 ns.

Figure 5A:
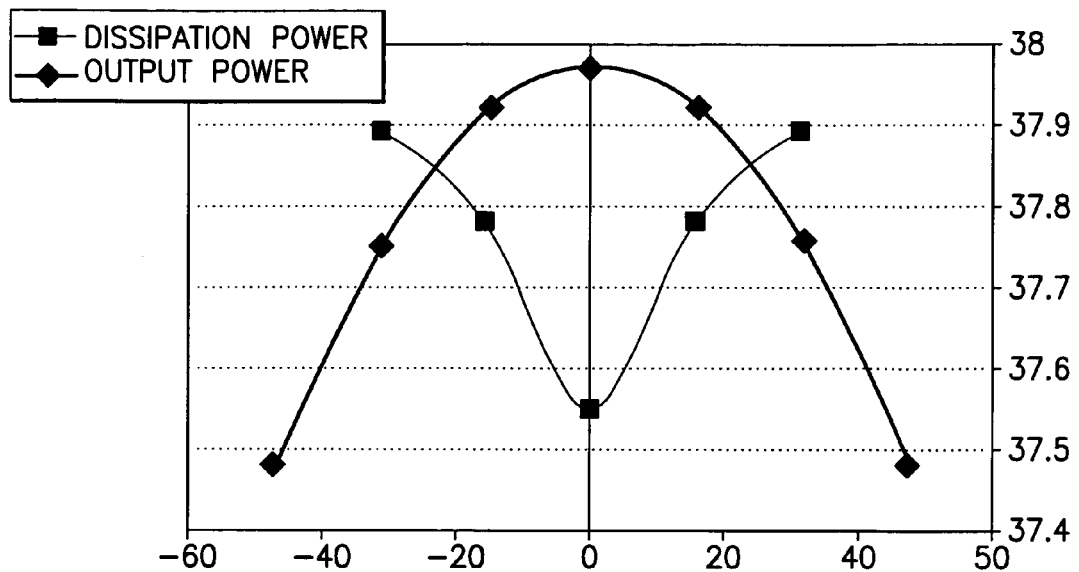
FIG. 5A is a graph of dissipation and output power for the combined signal plotted in FIG. 3A.
Figure 5B:
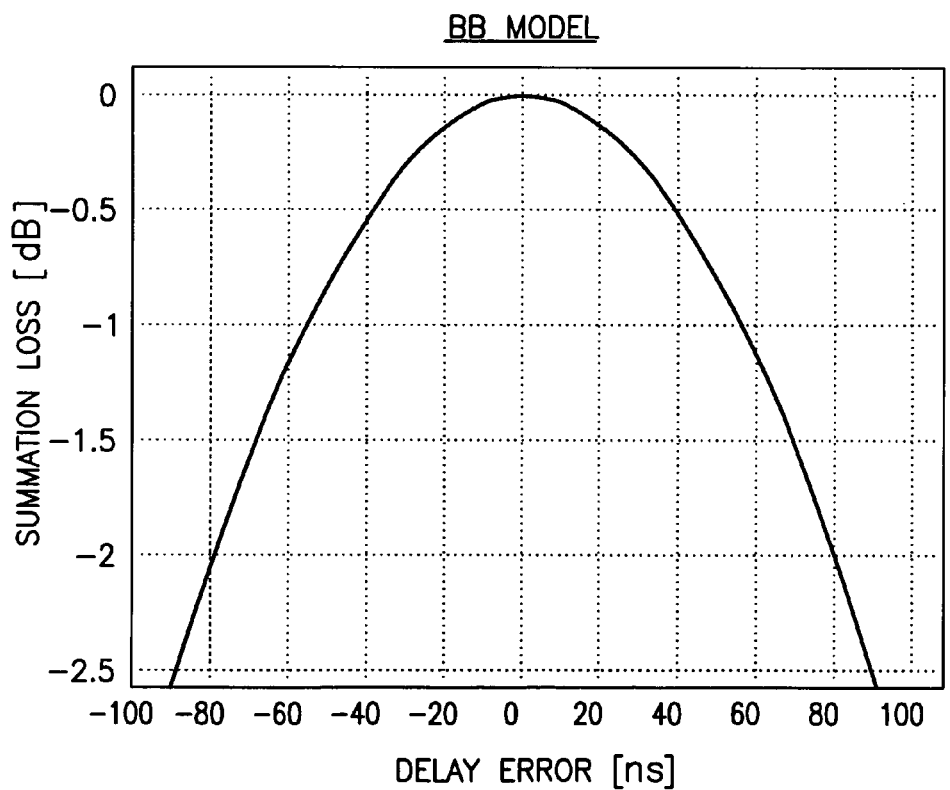
FIG. 5B is an expanded view of the baseband plot for a portion of FIG. 3A.

FIG. 5B is a closer view of a portion of FIG. 3A denoted by the common scale, but showing only the BB plot. FIG. 5A shows, for the same data as FIG. 5B, output power of the combined BB signal and dissipation power (measured at a dissipation port) of that same signal. For FIG. 5A, phase was kept at an optimal setting for combining, and only delay was changed. Note that FIG. 5A shows less than 0.1 dB signal loss due to phase error with summing of two 35 dB signals. This can be used to set the initial delay value (block 402), and for finding the optimum delay to set during calibration so as to maximize signal power from the summing unit 150.

Figure 6A:
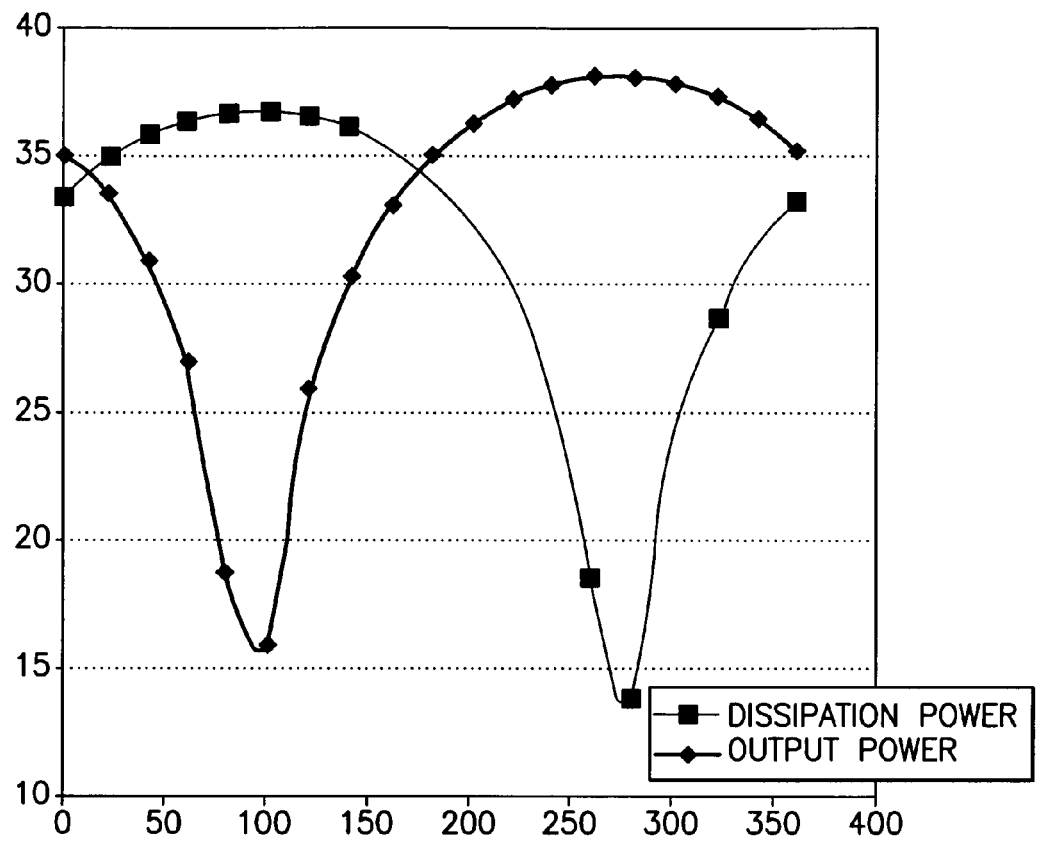
FIG. 6A is similar to FIG. 5A, but with phase held optimal and delay changed.
Figure 6B:
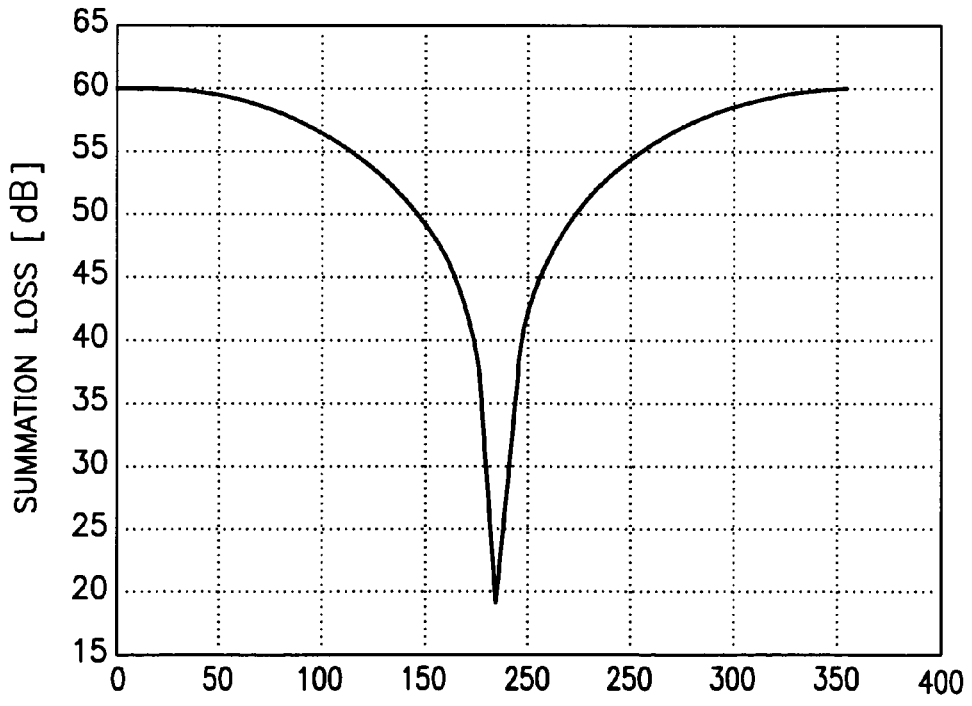
FIG. 6B is a graph of summation loss versus phase error for the signal plotted in FIG. 6A.

FIG. 6A is similar to FIG. 5A, but for the simulation where phase was changed and delay was kept the same. FIG. 6A shows that the optimal summing phase (about 185 degrees for the signals of this example) can be found to maintain output power at the target 35 dB. FIG. 6B shows loss due to summation in the summed signal of FIG. 6A, at various phases about the optimal.

The above graphical simulation data show that phase and delay adjustments are advantageously done at baseband BB rather than at IF or RF. Therefore, embodiments of this invention return the two signals through the predi chain as noted above, but that predi chain is extended to the baseband, via hardware for despreading, further downconverting, decoding, and the like. Such hardware is known in the art, and includes a correlator, frequency dividers for downconverting, decoders, etc. Also, rather than merely aligning phase and delay of two signals for calibration purposes, it will be appreciated that the same hardware can be used to beamform the different signals from different transmitters to more than one antenna (using modifications to the switch 160 detailed below), or to adapt power output by setting the delay so as to operate an adaptive antenna with varying power settings for communicating with a user equipment moving relative to a base transceiver station in which the hardware detailed above is disposed.

Figure 7A:
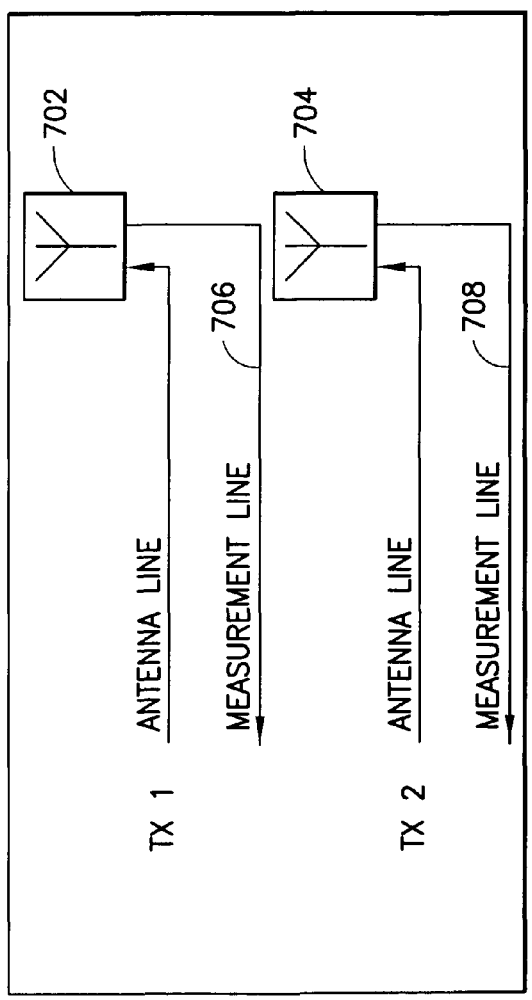
FIGS. 7A-C show three configurations of alternative delay measurement lines.
Figure 7B:
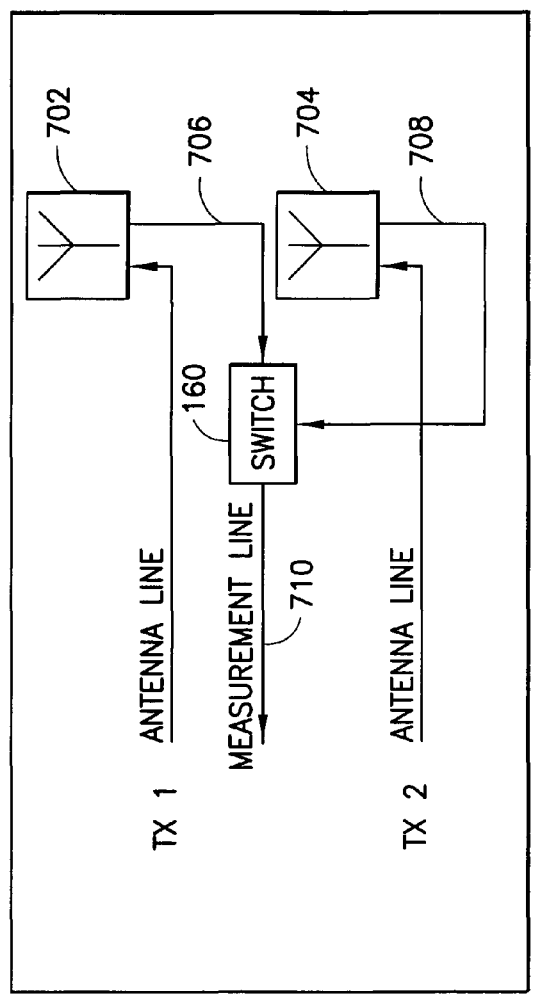
Figure 7C:
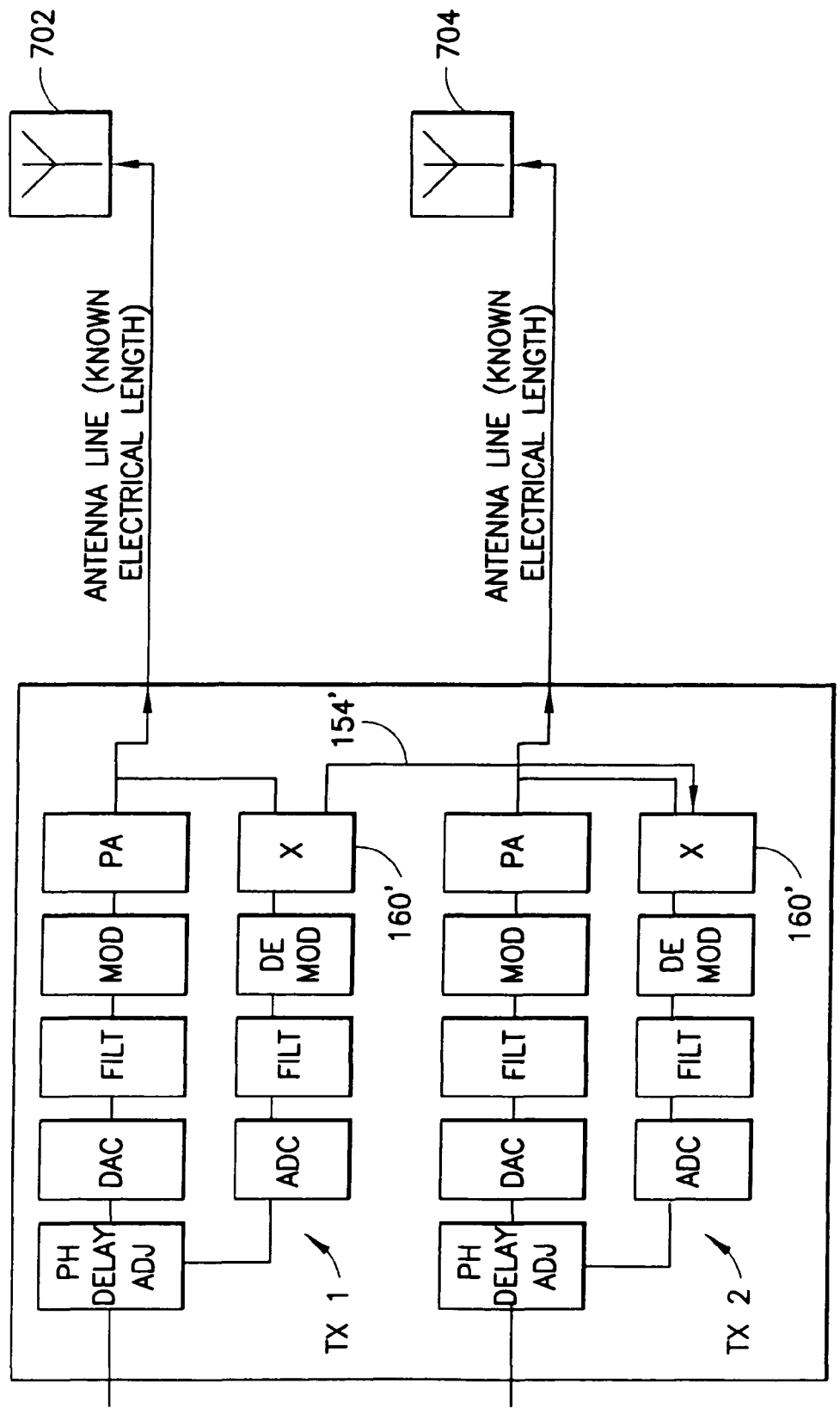

Returning to the concepts of FIGS. 1A-1C, alternative arrangements are shown in FIGS. 7A-C for the feedback pathway that the transmit signal may follow toward the switch 160 and predi chain in order that the phase and delay differences can be found. At FIG. 7A, a first transmitter TX1 is coupled to a first antenna, and a second transmitter TX2 is coupled to a second antenna 704. A measurement signal line 706, 708 then returns the transmit signal from each antenna 702, 704 back to the switch 160 and predi chain of the respective transmitter. The two transmit signals, exactly as presented to the antennas 702, 704, are then returned, summed, and one is phase and delay adjusted as above to properly calibrate or beamform the combined signal. FIG. 7B differs in that the measurement signal lines 706, 708 feed into a switch 160, which then returns the two transmit signals (either separately or combined) to one of the transmitters along a net return measurement signal line 710. As a further alternative, no additional feedback pathway from antenna to transmitter is present in FIG. 7C, but instead there is a modified crossover line 154' between two modified switches 160' on each transmitter feedback circuit. These switches 160' are modified in that their data ports which tie into the modified crossover line 154' are not bi-directional; only one transmitter of FIG. 7C can be master and the other slave, whereas in FIGS. 1A-1C the roles may be reversed merely by a different control signal 161 to the respective switch 160. FIG. 7C illustrates the case where TX2 is slaved to TX1 since the modified crossover line 154' is shown as uni-directional and carrying the transmit signal from TX1 to the switch 160' of TX2 but not the other way around. While valuable embodiments, as will be seen the particular bi-directionality of the switch 160 as previously described provide numerous and significant advantages over the embodiment of FIG. 7C.

Figure 8:
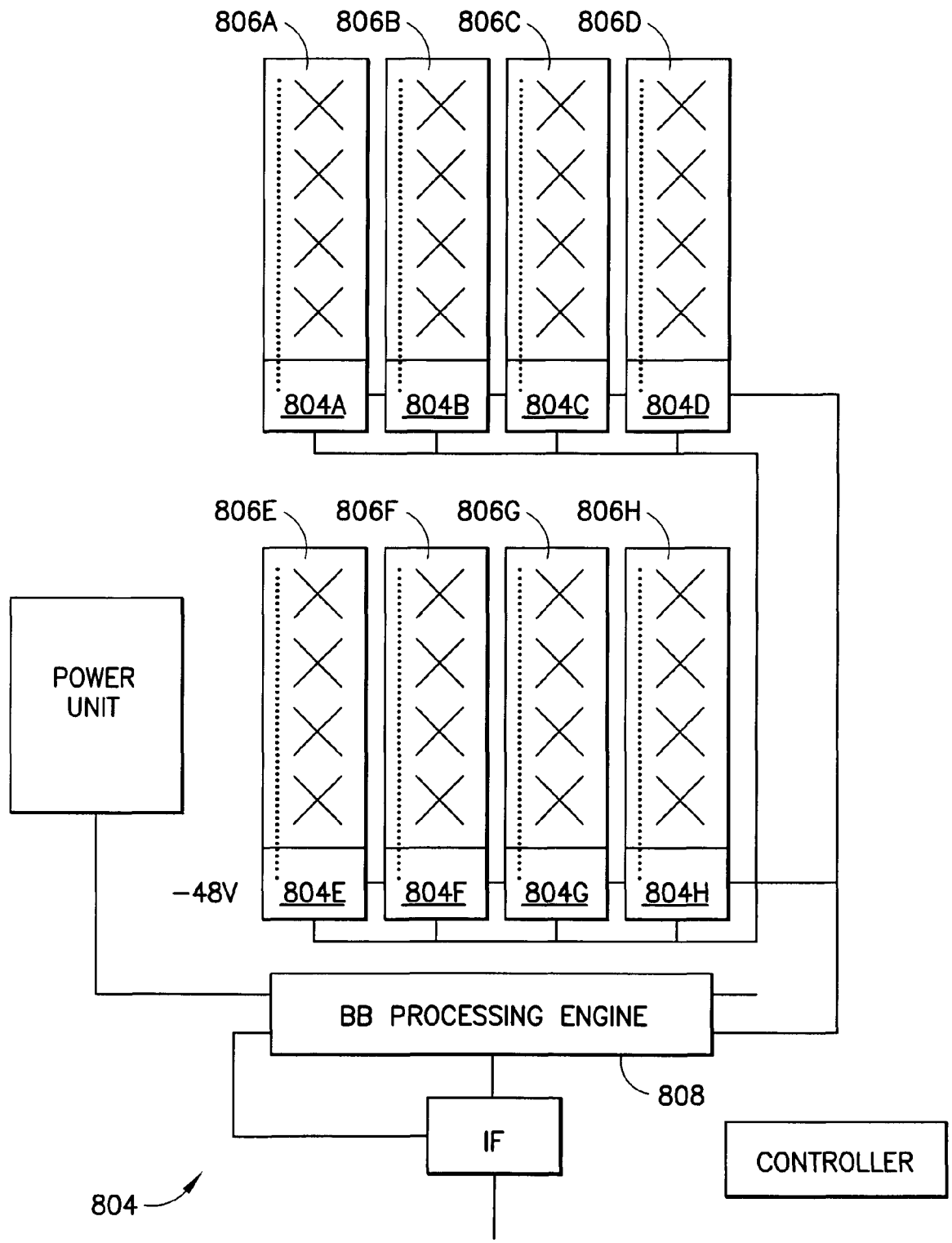
FIG. 8 is a schematic diagram showing configuration of a base transceiver station with eight transceivers according to an embodiment of this invention.

Now are described more advantageous embodiments of the invention. FIG. 8 illustrates a base transceiver station 802 with eight radio transmitters 804A-H and various circuitry that couples the transmitters to one another, and to the antenna elements of an array of antenna radiators. The eight illustrated radios therefore represent eight active antennas, though it is noted that any number of n radio transmitters may be used, n being an integer greater than one. For simplicity, consider that there is one transmitter/transceiver 804A-H for each antenna element (not shown), but any transceiver 804A-H (alternatively termed radios) may be coupled to any antenna or combination thereof, and any transceiver 804A-H may be paired with any other transceiver 804A-H as will be shown. Since both the transmit and receive circuitry of the transceiver are used as detailed above, these are generically termed radios. A common baseband processing engine 808 handles signals to and from each transceiver 804A-H. The transceiver 804A-H might be connected differently than is shown in FIG. 8, with redundant connections and variations in electrical path length of those connections being advantageous for robustness of the overall system and accuracy in the path length measurements (see FIGS. 9A-E). Where the phase and delay difference is measured as detailed above, the phase and delay corrections are independent of electrical path length differences between the radios because that data will already be reflected in the compared and differentiated signals.

Where the RF signal is spread over a wide frequency band (e.g., CDMA or similar spreading protocols), the common baseband BB processing block 808 includes a correlator for spreading/despreading the signal, as well as decoders and the like for error control and complex multipliers for the phase difference measurement and adjustment. Typically, this block 808 will be an application specific integrated circuit ASIC. Phase adjustments and delays are readily applied at the correlator, though other hardware may be used in other embodiments. The phases of signals from different transceivers can be tapped via crossover line 154, feedback signal line 158, or a probe that measures the combined field from any pair of antenna radiators in air. Delay may be imposed in any of multiple known ways, including a series of unit delay registers, various delay stages in the correlator, and the like. The controller (shown in FIG. 13 as a control unit 1310) sends the control signal to the switch 1000 at each radio (detailed below) to selectively couple various inputs to various outputs. This is different in kind than the enable signal seen in FIGS. 1A-1C, in that this control signal is coordinated among multiple switches to enable the multi-functionality detailed below with respect to FIGS. 12A-B and 13.

Figure 9B:
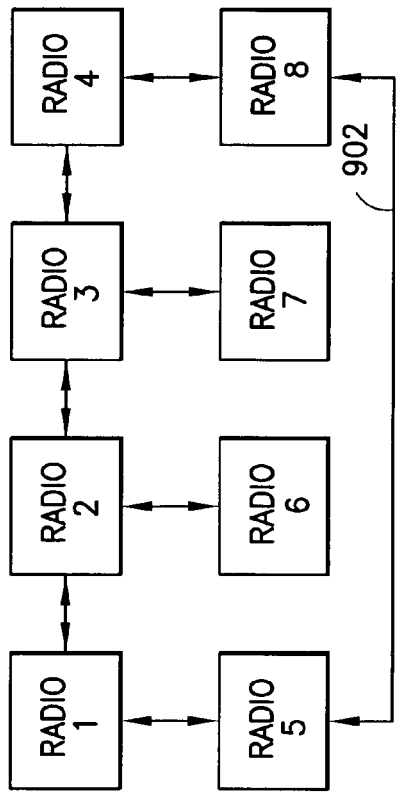
FIGS. 9A-E show different interconnections of radio transceivers according to various embodiments of the invention.
Figure 9A:
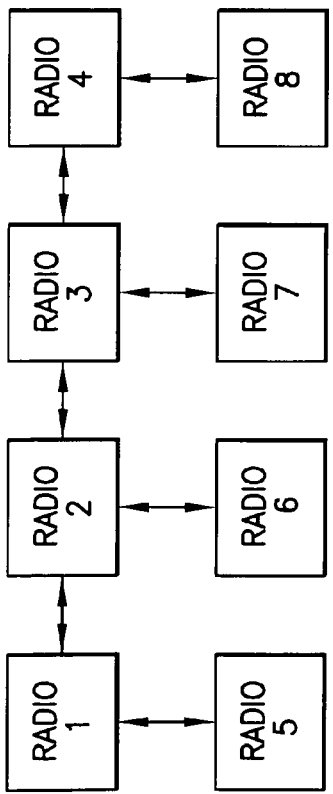

Interconnectivity using signal lines among the various transceivers 804A-H is shown in different embodiments at FIGS. 9A-D, where each bidirectional arrow indicates a coupling along a measurement pathway between switches 160 of the various transceivers/radios 1-8. At FIG. 9A, there is a minimum number of measurement pathways but no redundancy and no confirmation measurement path. Note that failure of one radio in FIG. 9A will lead to at least one other radio being unable to couple to that failed radio's antenna. FIG. 9B differs from FIG. 9A in that a confirmation measurement pathway 902 goes between radio 5 and radio 8, so radio 1 has two different pathways to radio 8. This allows some (minimal) redundancy; the greater value of the confirmation pathway is as an error detection/correction over an equivalent pathway between the same radios since this invention is directed toward calibration. However, the length of the confirmation pathway 902 is relatively long and subject to error. The cost of this confirmation pathway in FIG. 9B is slightly more than the minimum number of measurement pathways, which is a concern in the manufacturing regime.

Figure 9D:
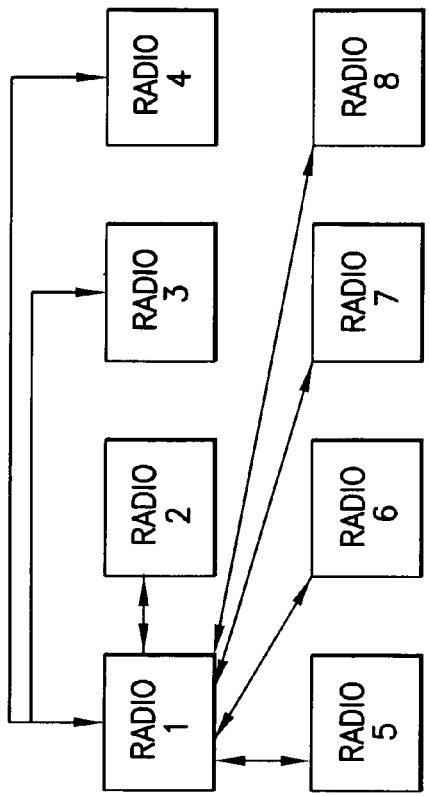
Figure 9C:
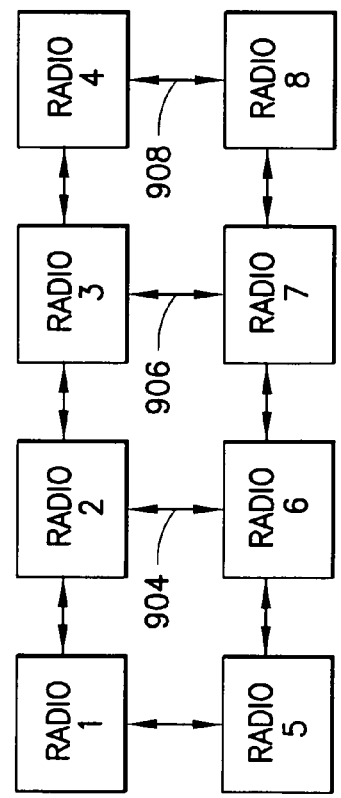

FIGS. 9C and 9D illustrate more confirmation pathways and redundancies. FIG. 9C has three additional measurement pathways 904, 906, 908, which offer reasonably good redundancy; any radio can fail and no other radios will be disconnected. There is good modularity to select different pairings/groups of radios for beamforming, and the conformation pathways 904, 906, 908 are short. FIG. 9D enables the minimum number of measurements to calibrate any pair of radios, and there is good accuracy as all radios are measured against one master (radio 1) so there are no summed errors. However, FIG. 9D would require complex cabling/signal pathways due to the numerous long measurement pathways, and more importantly there is no redundancy of the master radio (radio 1). If another radio were to be made redundant as a master, the number of measurement paths would be doubled or nearly so. From a cost-benefit view, the option of FIG. 9C appears the best for general purpose use of a fixed signal line embodiment. As will be seen, with the embodiment of FIG. 9C there is only one type of switch 160 that need be manufactured, common to all of the radios since at any given time any could be master with any other slave.

Figure 10:
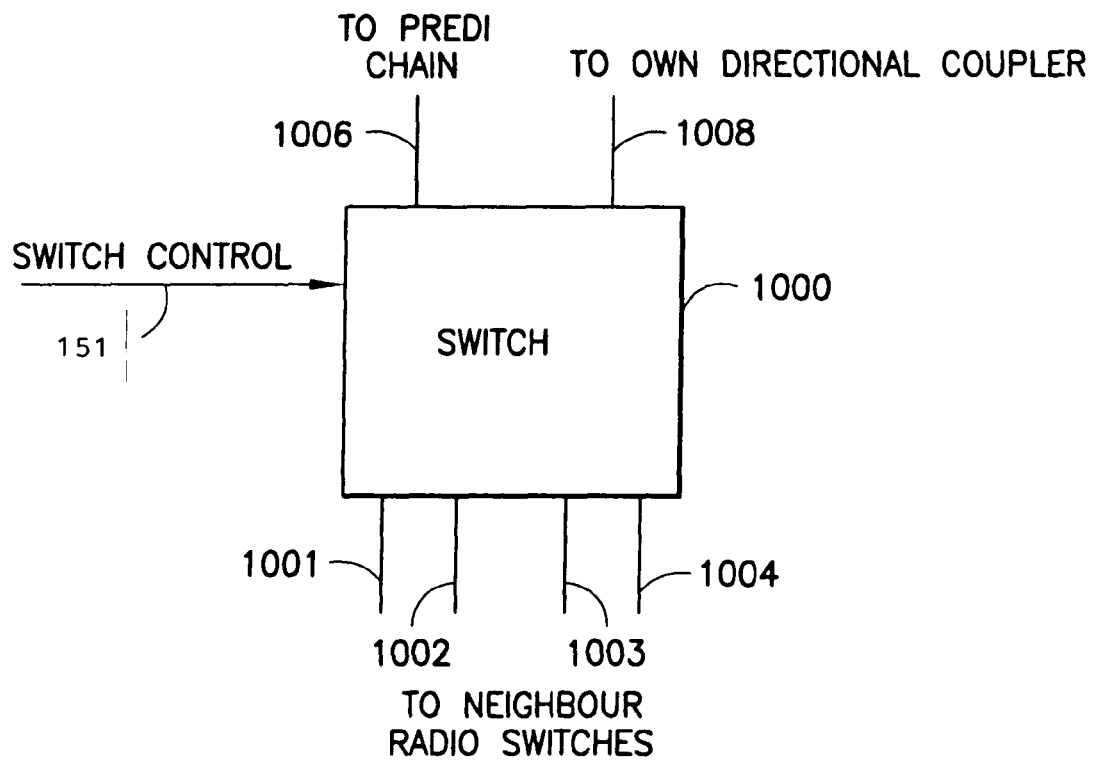
FIG. 10 is a schematic diagram of a switch used to interconnect transceivers according to any of FIGS. 9A-9D.

FIG. 10 shows detail of the switch 160 but adapted as switch 1000 for multiple neighbor radios/transceivers. A control input 151 is similar to 161 previously described with reference to FIGS. 1A-C. The signal lines/data ports 1001, 1002, 1003, 1004 couple to different radios/transmitters, similar to the crossover line 154 of FIG. 1A but selectively based on the control input 151, which in this case is from the controller of FIG. 8 (shown in FIG. 13 as a control unit 1316) rather than merely an enable signal. This selectively enables the switch to direct a transmit signal from its host transmitter (e.g., and input on signal line 1001, for example) to be output along any one of the other signal lines/data ports 1002-1004 to another radio (as signal line 182 of FIG. 1C), and where the phase adjustment is done at the host transmitter, for a transmit signal from another transmitter input on any data port 1002-1004 to be sent to the predi chain (output 1006) along with the host transmitter's own transmit signal (at data port 1001). In the context of FIG. 9C, each radio has a switch 1000 as in FIG. 10, with one signal line/data input port 1001 going to that same radio (e.g., for inputting the host radio's own transmit signal) and the remaining signal lines/bidirectional ports 1002-1004 going each to another radio to which it is bi-directionally coupled. The predi chain output/data output port 1006 inputs to the predi chain of the switch's host radio that in FIGS. 1A-C includes the feedback sub-circuit 166, filter 168, FB DAC 170, and delay/phase estimate/adjust blocks 114*a*, 114*b*, and preferably all the way to BB. This switch 1000 enables any transmitter to be coupled to any other transmitter for calibration of phase and delay of any transmitter pair. Only slight modification is necessary for the other embodiments of FIGS. 9A-B and 9D; more or less signal lines/bidirectional ports 1001-1004 depending on how many other radios are coupled to the one being considered.

An antenna port 1008 of the switch 1000 couples to a directional coupler that is disposed between the switch 1000 and an antenna radiating element (not shown). In this manner, a signal wirelessly received at the antenna can be selectively coupled to any of the data ports 1001-1004, or a transmit signal from any of various transmitters, received at any of the data ports 1001-1004, can be coupled to the antenna port 1008 for transmission from that antenna radiating element.

As was described with reference to FIGS. 9A-D (and as will be seen for FIG. 9E), the switch 1000 enables a simple and scalable measurement approach for phases. It also enables high degree of redundancy in the case that one or more of the radios become inoperable in that the measurement routes can be altered to avoid any transmitter that may not be fully operational (to the extent redundancy is built in, as with FIGS. 9A-9D). The switch functionality also enables comparing any two radios directly together. A feature of the switch 1000 is that a transmit signal input at any data port 1001-1004 can be output to any other data port 1001-1004 or to the switch's antenna (through antenna port 1008), enabling an array of such interconnected switches (with associated radios and antennas) to bypass the host radio and/or host antenna. That is, with the switch coupling multiple radios such as in the embodiments of FIGS. 9A-D, any arbitrary radio can transmit or receive from any arbitrary antenna; any pair of radios can be calibrated one to another; any radio can beamform from any arbitrary set of antennas, and any radio receiver can be used as a diversity receiver for any other radio receiver. Depending on redundancy, the interconnected switches can be used to avoid any radio or antenna that is out of service.

Figure 11A:
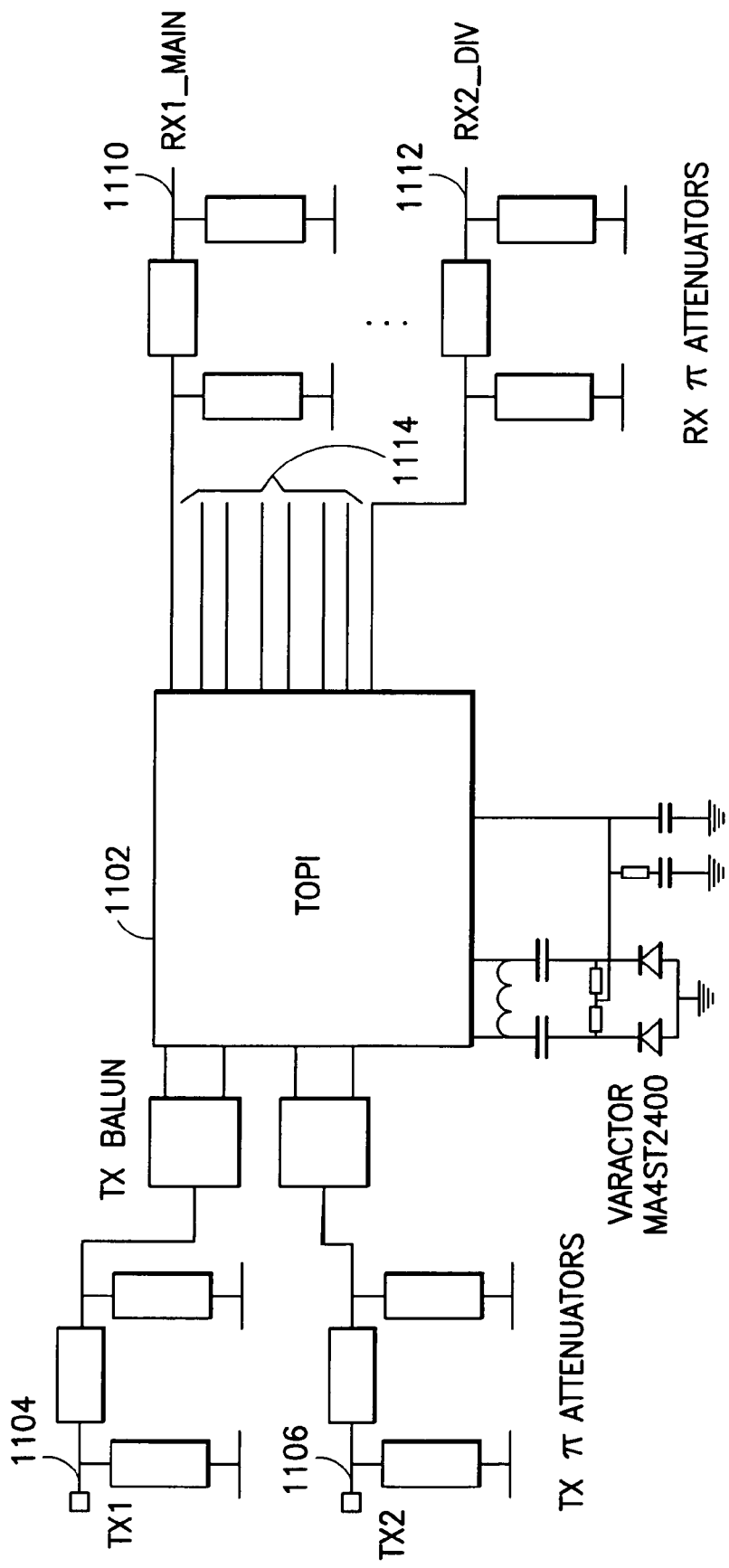
FIG. 11A is a schematic diagram of a phase and/or amplitude measurement circuit used with embodiments of the invention.
Figure 11B:
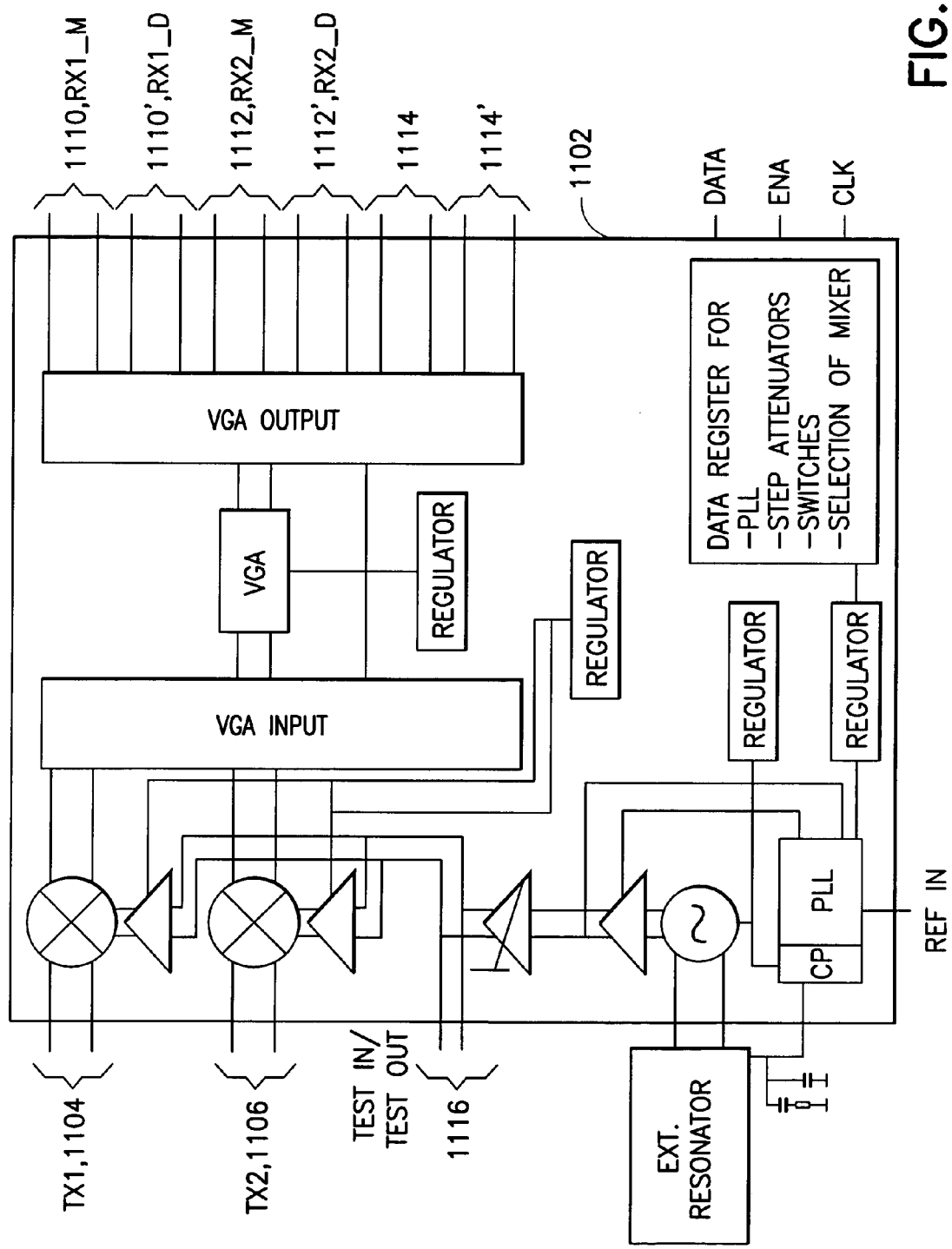
FIG. 11B shows details of the circuit of FIG. 11A.

The above description is directed toward calibrating a transmit signal, which as noted is readily adapted to beamforming transmit signals or adapting power at an antenna element for a moving user equipment. Below these same teachings are extended for receive calibration and MIMO detection. FIG. 11A shows an integrated transmission loop for two antennas with main and diversity receivers, termed a TOPI circuit 1102. Leads from a first antenna 1104 and from a second antenna 1106 pass through the TOPI circuit which selects any of eight receivers, two of which are shown at RX1 main 1110 and RX2 diversity 1112. Others are shown as reference number 1114. Any of the two signals received at antenna leads 1104, 1106 can be coupled through the TOPI circuit to any of the eight receivers 1110, 1112, 1114. Particulars of the TOPI circuit 1102 are shown at FIG. 11E, which also shows test nodes 1116. Outputs for each receiver number two, for main (unprimed reference numbers) and diversity (primed reference number). A video graphics array VGA chip is used to selectively couple the transmitters to the receivers, and a data register is shown for storing the indicated information of switches, phase locked loop settings, step attenuation, and mixer selection. The VGA is a ready solution for mapping the various inputs to outputs, though a more particularized chip or a generic non-video-based chip can do the same purpose. The TOPI circuit is independent of the specific transmitter and receiver; a single embodiment will operate with most known duplex separations.

Figure 12A:
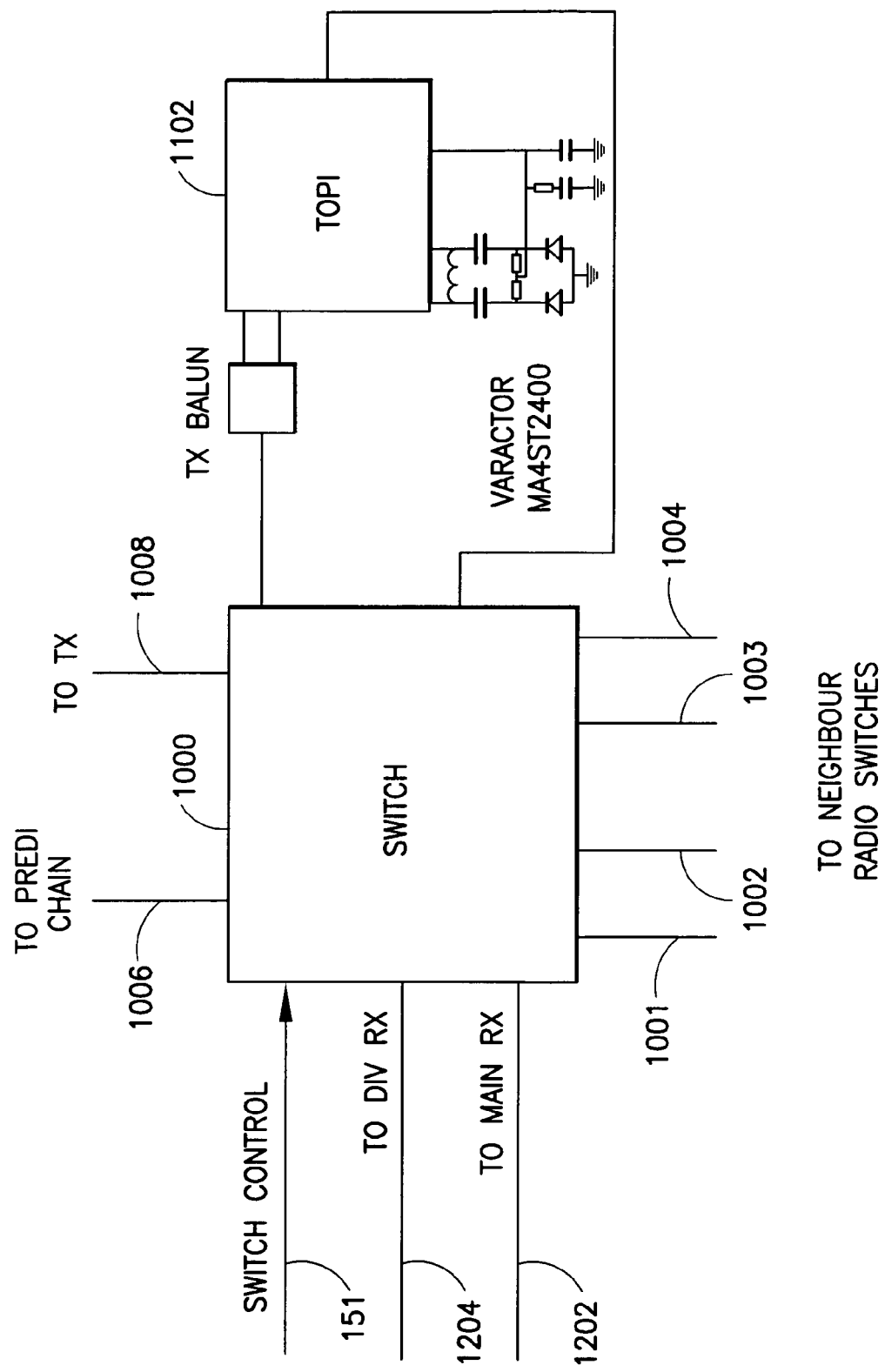
FIG. 12A shows one combination of the switch of FIG. 10 with the circuit of FIG. 11A adapted in accordance with an embodiment of the invention to support the radios of FIGS. 9A-9D.

FIG. 12A shows the switch 1000 in combination with the TOPI circuit with certain adaptations. The TOPI circuit is a detailed embodiment of how the selectivity of the switch 1000 can be achieved so that any input signal (a transmit signal from any transmitter input at data ports 1001-1004, or a wirelessly received signal input at antenna port 1008) can be sent to any radio. Specifically, the switch control 151 and output to the predi chain 1006 are as previously described, as are the radio leads 1001-1004. In order that a signal wireless received at the antenna and input to the antenna port 1008 of the switch 1000 can be received, the TOPI circuit couples that antenna port 1008 to a main receiver output 1202 and a diversity receiver output 1204. For the case where the signal wireless received at the antenna coupled to the antenna port 1008 is to be received at the main 1202 and diversity 1204 receivers associated with that antenna, the switch 1000 merely couples the antenna port 1008 to the input side of the TOPI circuit 1102. For the case where another main or diversity receiver is desired, the switch 1000 couples the antenna port 1008 to one of the neighbor switches by selecting one of the data ports 1001-1004. At that neighbor switch, the received wireless signal input at one of its data ports 1001-1004 is then coupled to the input side of the TOPI circuit 1102 and output at one or both of the main receiver port 1202 or diversity receiver port 1204. Thus, a signal wirelessly received at any antenna can be ported to any of the various radio receivers that are all interconnected by the arrangement of switches. The switch 1000 adapted in this way enables a nearly unlimited number of measurement topologies, changing only the number of signal leads 1001-1004 as appropriate for the number of neighbor radios each radio is coupled to.

Figure 9E:
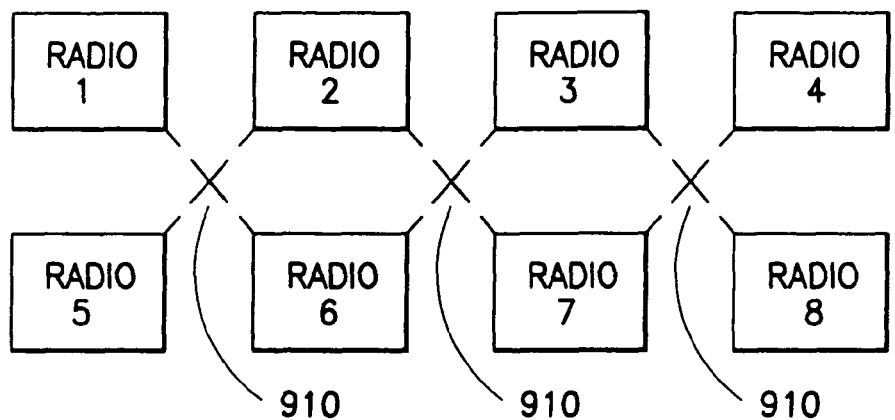

As noted above, embodiments of this invention also enable calibration using a probe, rather than (or in conjunction with) signal combination in hardware. FIG. 9E shows such an arrangement, with a calibration probe spaced equidistant between each cluster of four radios. Each radio is coupled to the probe for tapping a combined signal sensed at the probe and for deriving phase and delay errors from it. Rather than measure phase error from a signal combined in hardware, in the probe embodiment the signal is combined in air and sensed at the probe, and manipulated afterwards. Alternatively but with additional processing, different signals from different transmitters can be sensed at the probe separately and combined in hardware after reception. In either instance, the phase difference circuitry is largely similar to that detailed above, with exceptions shown at FIG. 12B. The co-owned patent application, incorporated by reference above, details particularly advantageous embodiments of such a probe and its specific placement with respect to the active antenna radiators.

Figure 12B:
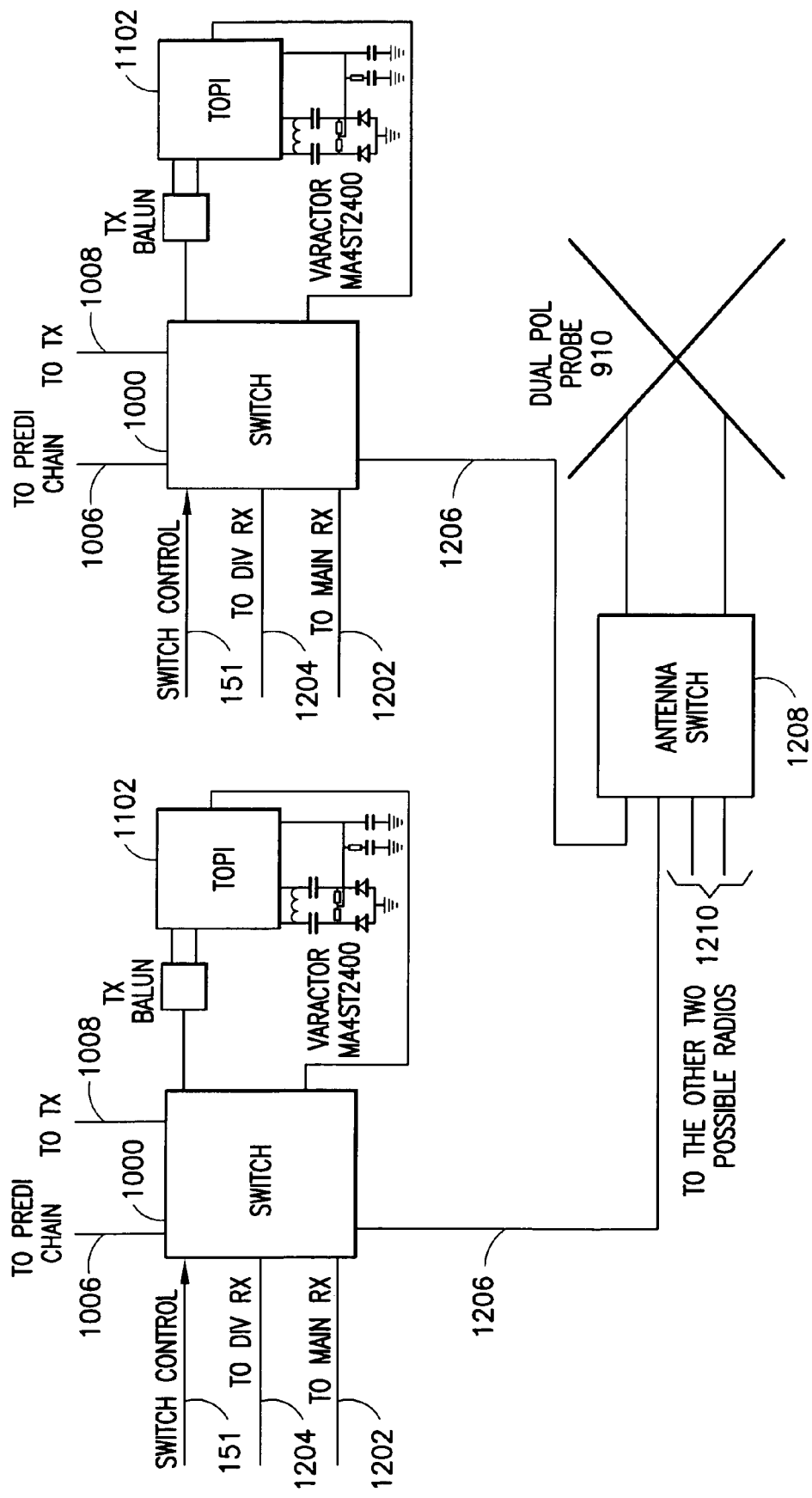
FIG. 12B shows one combination of the switch of FIG. 10 with the circuit of FIG. 11A adapted in accordance with an embodiment of the invention to support the radios of FIG. 9E.

FIG. 12B shows that rather than four signal lines 1001-1004, each switch 1000 has one signal line 1206 to an antenna switch 1208 that selectively enables any two switches 160 to receive the signal from the same probe 910. Each of those switches 1000 then outputs the received signal to either or both of its main 1202 and diversity 1204 receiver, and the signal combined in air and received at the probe 910 is then used to calibrate a main receiver with its diversity receiver, both main receivers, both diversity receivers, or pairs of opposite main and diversity receivers, not unlike was done on the transmit end. Note that this probe functionality may be combined with the multiple data ports 1001-1004 detailed above, and not necessarily in place of them as seen in FIG. 12B.

The TOPI circuit 1102 also enables transmit phase correction in that the probe 910 can be used in many instances as an independent antenna. Note the additional leads from the antenna switch 1208, consistent with the four-way coupling shown in FIG. 9E. Any different number of leads can be used to couple in more or less than four radios per probe 910. For calibration, the combined signal can be sensed or the individual signals from different transmitters can be sensed (at different times) at the probe.

Generically then, the switch 1000 enables selective coupling of any of n transmitters in an array to any of n receivers in the array, where n is greater than one. In embodiments shown, this coupling is through another instance of the switch at the coupled transmitter/receiver. As seen with the TOPI circuit 1102, the switch 1000 can also couple the antenna loop of that TOPI circuit in between any of the various transmitters and receivers, and thereby bidirectionally couple any antenna to any transmitter or receiver.

Figure 13:
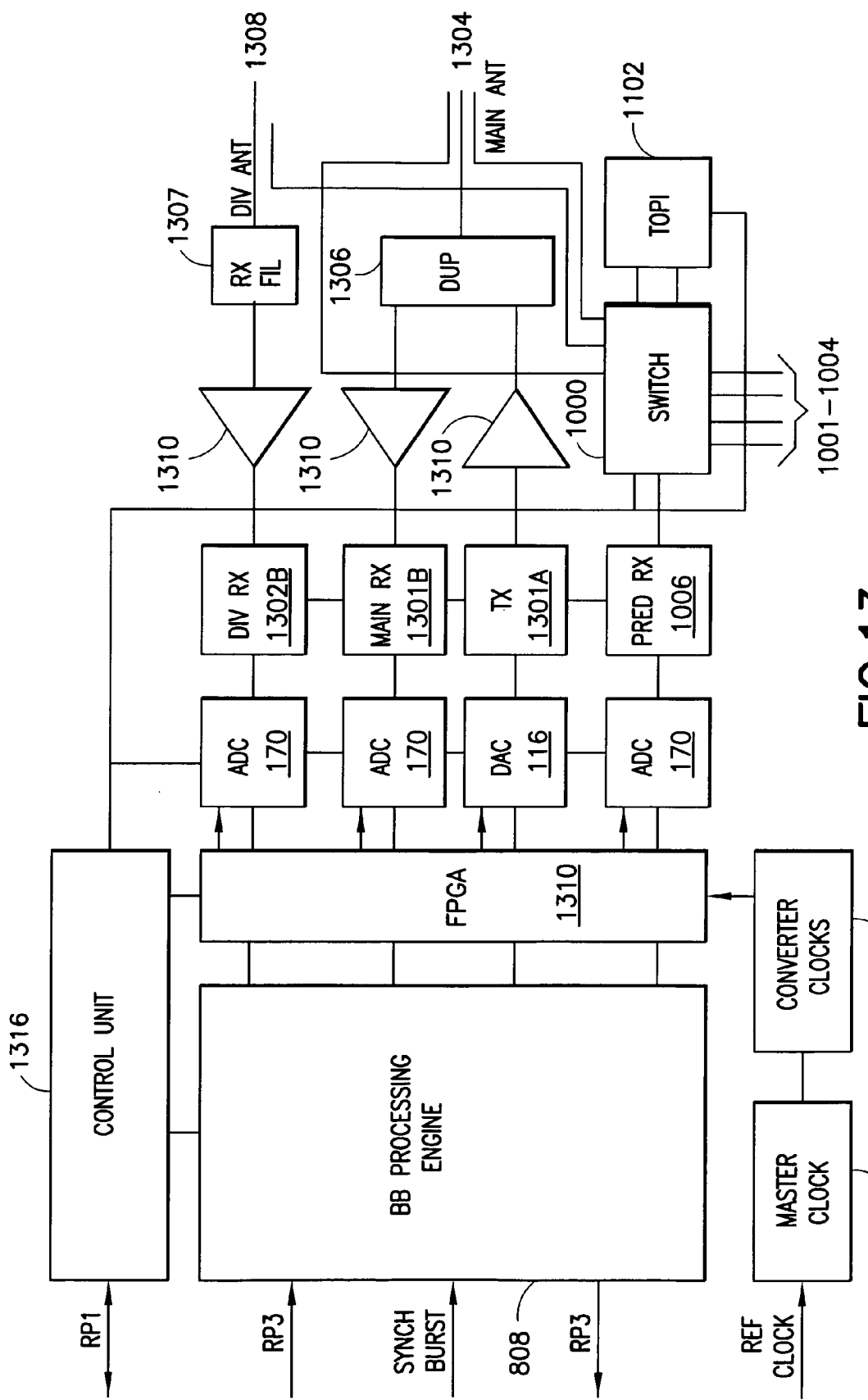
FIG. 13 is a schematic block diagram showing relative arrangements of the switch of FIG. 10, the circuit of FIG. 11A, and various transceivers in a base transceiver station according to an embodiment of the invention.

FIG. 13 is a schematic block diagram showing further detail from FIG. 8 for one transmitter 1301A, its corresponding receiver 1301B, and a diversity receiver 1302B from another radio. The controller of FIG. 8 is shown as the control unit 1316, which sends control signals to the various switches for selective coupling of the descried inputs to outputs detailed above. Note that the one transmitter 1301A and receiver 1301B are coupled to one (main) antenna 1304 (through a diplex filter 1306) and the diversity receiver 1302B is coupled (through a receive filter 1307) to its own antenna 1308, which for the functionality described with respect to FIG. 13 and the main transceiver 1301A-B is termed the diversity antenna 1308. The main receiver 1301B and transmitter 1301A are considered the host radio to which the illustrated switch 1000 and TOPI circuit 1102 are associated. Various power amplifiers 1310 are also shown. One addition to the switch of FIG. 13 is that a diversity antenna port is added, bidirectionally coupling the switch 1000 to the diversity antenna 1308 as well as the main antenna 1304 as was described above for the antenna port 1008.

The BB processing engine 808 of FIG. 8 is shown in two parts: a field programmable gated array FPGA 1310 and the remainder of the BB processing engine 808. The FPGA 1310 is where the correlator is located and where the phase errors as detailed above are estimated and applied. FIG. 13 describes applying the phase error for a received signal, though similar processing in reverse is done for transmit diversity and beamforming as detailed above. A signal is received at each of the main 1304 and diversity 1308 antennas, each received signal is split, and passed in one instance to the switch 1000 that enables further receivers to be switched in and out to process the signal similarly as detailed above. The switch 1000 taps the signal from both the main 1304 and the diversity 1308 antennas, and can direct either of those signals to any pair of receivers, even apart from the main 1301B and diversity 1302B receivers shown in FIG. 13 that are already directly coupled to those respective antennas 1304, 1308. Various ADCs 170 and DACs 116 coupled the various transmitters and receivers to the FPGA 1310, which operates in the digital domain and couples the signals from any pair of receivers (or to any pair of transmitters) to the baseband processing engine 808 from FIG. 8.

The received signal (from the main antenna 1304 and/or the diversity antenna 1308) is also passed from the switch 1000 to the predi chain 1006 to the FPGA 1310. Both signals from the same (main or diversity) antenna are present together for the first time in the FPGA 1310, so any phase difference between signals received at the same antenna can be measured and compensated as detailed above (like the delay/phase estimating block 114a and delay/phase adjustment block 114b of FIGS. 1A-C) at the correlator or other hardware located in that FPGA 1310. Phase measurement may be by a simple measure and compare circuit within the FPGA 1310, and phase adjustment may be by a phase rotator or delay stage in that same FPGA 1310. While phase error may be corrected at various stages, preferably phase error is measured after despreading. Timing is referenced to a master clock 1312 via one or more converter clocks 1314 to the various hardware.

On the transmit side, a transmit signal from another transmitter may be input to the switch at one of the data ports 1001-1004, and output to either the main antenna 1304 or the diversity antenna 1308 or both, such as for example if the transmitter 1301A shown in FIG. 13 were out of operation due to maintenance or malfunction. In this manner, the reduction in number of radios at a base transceiver station BTS need not reduce the beamforming options or MIMO pathways available to the BTS, since all antennas would remain available even if the radio of one active antenna is not.

Note that in an integrated circuit (which may be on one or several substrates), multiple transceivers can be imprinted and share the same BB processing engine 808/FPGA 1310, whereas FIG. 13 shows only one transceiver and a diversity receiver. Note also that each transceiver will be paired with its own switch 1000, so that the various transceivers couple to one another through interconnected data ports 1001-1004 of their respective switches (and through an additional antenna switch 1208 for the embodiments where a probe is used), and the control unit 1316 operates as control over the plurality of switches 1000 to selectively couple any pair of n transmitters to any receiver, or any pair of n receivers to any transmitter, or any nth antenna to any of the n receivers or transmitters. (subject to the interconnection limitations of the various embodiments of FIGS. 9A-E).

FIG. 13 is a schematic block diagram of one or more integrated circuits in which the present invention may be embodied, advantageously disposed within a BTS. Embodiments of the invention may be disposed in any host computing device having a wireless link to another node, whether or not that wireless link is cellular/PCS, IP protocol, or the like. Embodiments of this invention may also be disposed in mobile user equipment such as a mobile station, though its immediate advantage is seen for a BTS. Such a host device includes a pair of transceivers, a processor, and a computer readable memory for storing software programs of computer instructions executable by the processor for performing actions related to this invention. Such hardware is shown at FIG. 13, where the memory is included with the illustrated chips (BB processing engine 808, FPGA 1310, control unit 1316), or the memory may be separate from those. Another exemplary use is within an orbiting (communication) satellite or non-orbiting space probe.

Known types of antenna radiating elements include monopole, di-pole, planar inverted folded antenna PIFA, and others, any of which are appropriate for embodiments of this invention.

Figure 2:
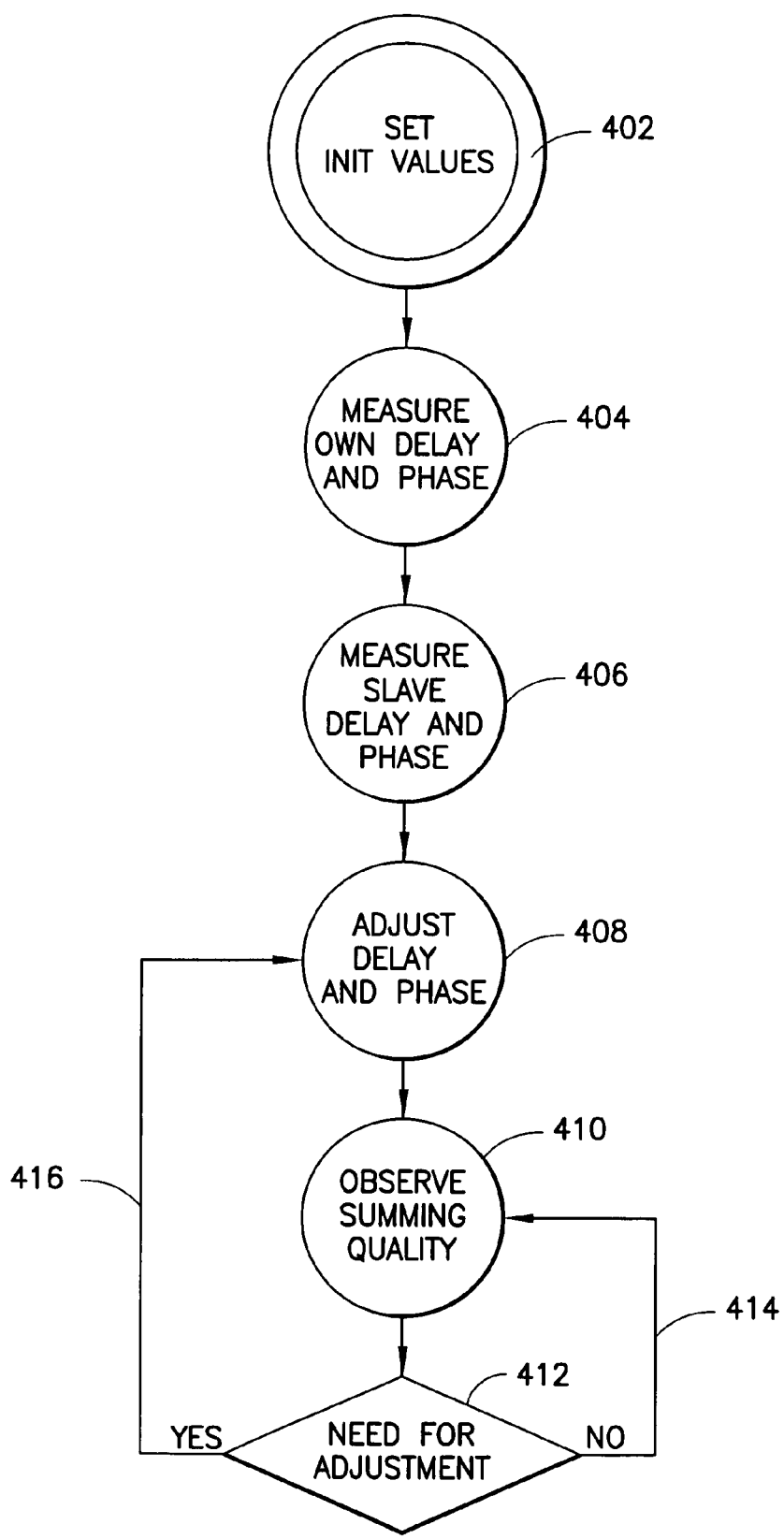
FIG. 2 is a logic flow diagram according to an embodiment of the invention.

The embodiments of this invention may be implemented by computer software executable by a data processor of the host device, such as the processor (808, 1310, 1316 or their combination), or by hardware, or by a combination of software and hardware. Further in this regard it should be noted that the various blocks of the logic flow diagram of FIG. 2 may represent program steps, or interconnected logic circuits, blocks and functions, or a combination of program steps and logic circuits, blocks and functions.

The memory or memories may be of any type suitable to the local technical environment and may be implemented using any suitable data storage technology, such as semiconductor-based memory devices, magnetic memory devices and systems, optical memory devices and systems, fixed memory and removable memory. The data processor(s) 808, 1310, 1316 may be of any type suitable to the local technical environment, and may include one or more of general purpose computers, special purpose computers, microprocessors, digital signal processors (DSPs) and processors based on a multi-core processor architecture, as non-limiting examples.

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof. Further, those claims employing the term 'comprising' encompass embodiments that include the recited features in combination with other features that are not explicitly recited.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope and spirit of the invention as set forth above, or from the scope of the ensuing claims.

What is claimed is:

1. A switch comprising:
    a first data input adapted to input a transmit signal;
    a first data output;
    at least one bidirectional data port; and
    a control input adapted to selectively couple in a first case the first data input to the bidirectional data port, and in a second case the bidirectional data port and the first data input to the first data output.

2. The switch of claim 1, comprising at least two bidirectional data ports, wherein the control input is adapted to selectively couple in the first case the first data input to any of the at least two bidirectional data ports, in the second case the first data input and any one of the bidirectional data ports to the first data output, and in a third case any one of the bidirectional data ports to any of the other bidirectional data ports.

3. The switch of claim 2, further comprising an antenna port adapted to bidirectionally couple an antenna to any of the bidirectional data ports.

4. The switch of claim 3 wherein the first data output is adapted to couple to a frequency downconverter, the switch further comprising a second data output adapted to couple to a receiver, and wherein the control input is further adapted to selectively couple in one case the antenna port to the second data output and in another case any of the data ports to the second data output.

5. The switch of claim 4, in combination with a transmitter having an output coupled to the first data input, a frequency downconverter having an input coupled to the first data output, and a receiver coupled to the second data output.

6. The switch of claim 4, wherein the said apparatus comprises a first switch, said first switch in combination with a second switch identical to said first switch, wherein a data port of said first switch is coupled to a bidirectional data port of said second switch.

7. The switch of claim 1, wherein the bidirectional data port is adapted to couple to an antenna calibration probe.

8. An array of radios, each radio comprising:
    a transmitter including a phase estimation and adjustment block; and
    a switch, the switch comprising:
        a first data input coupled to an output of the transmitter;
        a first data output coupled to an input of the phase estimation and adjustment block;
        at least one bidirectional data port; and
        a control input adapted to selectively couple in a first case the first data input to the bidirectional data port, and in a second case the bidirectional data port and the first data input to the first data output;
    wherein a bidirectional data port of each switch is coupled to a bidirectional data port of at least one other switch;
    the array of radios further comprising a processor having outputs coupled to each of the control inputs of the switches for coordinating said selective coupling, among switches that are coupled to one another via their bidirectional data ports.

9. The array of claim 8, further comprising a baseband processing engine including a field programmable gated array having inputs coupled to each of the switches' first data outputs, and further having outputs coupled to inputs of each of the switches' transmitters.

10. The array of claim 8, wherein each radio further comprises a receiver, and wherein each switch further comprises a second data output coupled to an input of the receiver; wherein, the control input is further adapted to selectively couple the bidirectional data port to the second data output.

11. The array of claim 8 wherein each switch further comprises an antenna port and each radio further comprises an antenna element coupled to the antenna port of the radio's switch,
    and wherein the control input is further adapted to selectively couple in one case the antenna port to the bidirectional data port and in another case the antenna port to the second data output.

12. The array of claim 8 further comprising at least one antenna calibration probe having outputs coupled to the data ports of at least two switches and inputs coupled to at least two transmitters.

13. The array of claim 8 disposed within a base transceiver station.

14. A method comprising:
    processing in a feedback circuit a first transmit signal from a first transmitter;
    measuring a first phase of the processed first transmit signal;
    processing in the feedback circuit a second transmit signal from a second transmitter;
    measuring a second phase of the processed second transmit signal;
    determining a phase difference between the first phase and the second phase; and
    adjusting another signal input to the first transmitter using the phase difference;
wherein processing the first and second transmit signal are done simultaneously with a combined signal comprising the first and second transmit signal, and wherein measuring the first and second phases comprise comparing a phase of the combined signal to a reference value to determine the phase difference.

15. The method of claim 14, wherein measuring the first phase and the second phase is at baseband.

16. The method of claim 14, wherein the combined signal is received from an antenna calibration probe.

17. The method of claim 14, wherein the first and second transmitter outputs are received wirelessly from an antenna calibration probe that is coupled to the first and second switches.

18. A method comprising:
    processing in a feedback circuit a first transmit signal from a first transmitter;
    measuring a first phase of the processed first transmit signal;
    processing in the feedback circuit a second transmit signal from a second transmitter;
    measuring a second phase of the processed second transmit signal;
    determining a phase difference between the first phase and the second phase; and
    adjusting another signal input to the first transmitter using the phase difference;
wherein processing the second transmit signal comprises sending to a first selective switch a first control signal that couples a bidirectional data port to the feedback circuit.

19. The method of claim 18, wherein processing the second transmit signal further comprises sending to a second selective switch, having a bidirectional data port coupled to the first switch bidirectional data port, a second control signal that couples an output of the second transmitter to the second switch bidirectional data port.

20. An apparatus comprising a processor, a switch, a transmitter, a phase estimator, a phase adjuster, and a frequency downconverter, wherein the switch comprises:
- a first data input coupled to an output of the transmitter;
- a first data output coupled to an input of the phase estimator through the frequency downconverter;
- at least one bidirectional data port; and
- a control input coupled to the processor and adapted to selectively couple in a first case the first data input to the bidirectional data port, and in a second case the bidirectional data port and the first data input to the first data output.

21. The apparatus of claim 20, wherein the switch comprises at least two bidirectional data ports, wherein the control input is adapted to selectively couple in the first case the first data input to any of the at least two bidirectional data ports, in the second case the first data input and any one of the bidirectional data ports to the first data output, and in a third case any one of the bidirectional data ports to any of the other bidirectional data ports.

22. The apparatus of claim 21, further comprising a directional coupler having one port coupled to an antenna port of the switch and an opposed port adapted to couple to an antenna, wherein the control input is further adapted to selectively couple the antenna port to any of the bidirectional data ports.

23. The apparatus of claim 22 further comprising a receiver, wherein the switch further comprises a second data output coupled to an input of the receiver, and wherein the control input is further adapted to selectively couple in one case the antenna port to the second data output and in another case any of the data ports to the second data output.

24. The apparatus of claim 23, wherein the said switch comprises a first switch and the said transmitter comprises a first transmitter, said integrated circuit further comprising an additional transmitter, an additional receiver, and an additional switch coupled to one another as the first transmitter, receiver and switch are coupled to one another, and wherein a bidirectional data port of the first switch is coupled to a bidirectional data port of the additional switch.

25. The apparatus of claim 24, wherein the first data output of both the first and second switch is coupled to an input of the same phase estimator through the same frequency downconverter.

26. The apparatus of claim 25 disposed within a base transceiver station.

27. The apparatus of claim 20, wherein the bidirectional data port is adapted to couple to an antenna calibration probe.

28. A computer readable storage medium, storing a computer program of instructions that when executed cause a digital processor to execute operations directed toward selectively coupling transceivers to one another, the operations comprising:
- switching a first transmit signal from a first transmitter output through a first switch to a feedback circuit;
- switching a second transmit signal from a second transmitter output through a second switch to the feedback circuit via the first switch;
- finding a difference in phase between the first and second transmit signals; and
- adjusting phase of a signal input to one of the first and second transmitters based on the difference;

wherein switching the first and second transmit signal are done simultaneously with a combined signal comprising the first and second transmit signal, and wherein finding the difference in phase between the first and second phases comprise comparing a phase of the combined signal to a reference value to determine the phase difference.

29. The computer readable storage medium of claim 28, wherein the first and second transmit signals are at a transmit radiofrequency and finding the difference and adjusting phase are at a baseband frequency.

* * * * *